(12) United States Patent
Savant et al.

(10) Patent No.: US 12,074,028 B2
(45) Date of Patent: *Aug. 27, 2024

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chandrashekhar Prakash Savant, Hsinchu (TW); Tien-Wei Yu, Kaohsiung (TW); Chia-Ming Tsai, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/053,234

(22) Filed: Nov. 7, 2022

(65) Prior Publication Data

US 2023/0122103 A1 Apr. 20, 2023

Related U.S. Application Data

(63) Continuation of application No. 17/081,879, filed on Oct. 27, 2020, now Pat. No. 11,495,463.

(51) Int. Cl.
*H01L 21/28* (2006.01)
*H01L 21/8238* (2006.01)
(Continued)

(52) U.S. Cl.
CPC ............ *H01L 21/28088* (2013.01); *H01L 21/823821* (2013.01); *H01L 21/823842* (2013.01);
(Continued)

(58) Field of Classification Search
CPC ....... H01L 21/28088; H01L 21/823821; H01L 21/823842; H01L 27/0924; H01L 29/4966; H01L 29/66795; H01L 29/7851
See application file for complete search history.

(56) References Cited

U.S. PATENT DOCUMENTS

| 7,015,116 B1 | 3/2006 | Lo et al. |
| 8,962,400 B2 | 2/2015 | Tsai et al. |

(Continued)

OTHER PUBLICATIONS

Tan, Philip Beow Yew, et al., "Measuring STI Stress Effect on CMOS Transistor by Stepping through the Channel Width," 2006 International RF and Microwave Conference Proceedings (Sep. 12-14, 2006), 3 pages.

(Continued)

*Primary Examiner* — Christine A Enad
(74) *Attorney, Agent, or Firm* — Sterne, Kessler, Goldstein & Fox P.L.L.C.

(57) ABSTRACT

The present disclosure describes method to form a semiconductor device with a diffusion barrier layer. The method includes forming a gate dielectric layer on a fin structure, forming a work function stack on the gate dielectric layer, reducing a carbon concentration in the work function stack, forming a barrier layer on the work function stack, and forming a metal layer over the barrier layer. The barrier layer blocks a diffusion of impurities into the work function stack, the gate dielectric layer, and the fin structure.

20 Claims, 16 Drawing Sheets

(51) Int. Cl.
*H01L 27/092* (2006.01)
*H01L 29/49* (2006.01)
*H01L 29/66* (2006.01)
*H01L 29/78* (2006.01)

(52) U.S. Cl.
CPC ...... *H01L 27/0924* (2013.01); *H01L 29/4966* (2013.01); *H01L 29/66795* (2013.01); *H01L 29/7851* (2013.01)

(56) References Cited

U.S. PATENT DOCUMENTS

| | | | |
|---|---|---|---|
| 9,093,514 B2 | 7/2015 | Tsai et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,812,363 B1 | 11/2017 | Liao et al. | |
| 9,859,380 B2 | 1/2018 | Lee et al. | |
| 11,495,463 B2 * | 11/2022 | Savant | H01L 27/0924 |
| 2014/0077279 A1 | 3/2014 | Tu | |
| 2015/0270122 A1 | 9/2015 | Tolle et al. | |
| 2015/0348966 A1 | 12/2015 | Zhao et al. | |
| 2016/0049335 A1 | 2/2016 | Liu et al. | |
| 2016/0148932 A1 | 5/2016 | Fujita et al. | |
| 2016/0308048 A1 | 10/2016 | Ching et al. | |
| 2017/0125536 A1 | 5/2017 | Chen et al. | |
| 2017/0250183 A1 | 8/2017 | Brunco | |
| 2019/0279909 A1 * | 9/2019 | Lu | H01L 21/823842 |
| 2020/0105895 A1 | 4/2020 | Tang et al. | |
| 2020/0135475 A1 | 4/2020 | Cheng et al. | |
| 2020/0135915 A1 * | 4/2020 | Savant | H01L 21/0228 |
| 2020/0365706 A1 | 11/2020 | Lee et al. | |

OTHER PUBLICATIONS

Luo, Jie-Xin, et al., "The Impact of Shallow-Trench-Isolation Mechanical Stress on the Hysteresis Effect of Partially Depleted Silicon-on-Insulator n-Type Metal-Oxide-Semiconductor Field Effects," Chin.Phys.Lett. vol. 31, No. 12 (2014) 126601, 4 pages.

Yang, Wenwei, et al., "Analysis of GIDL Dependence on STI-induced Mechanical Stress," Institute of Microelectronics, Tsinghua University, Beijing, China, (2005), 4 pages.

\* cited by examiner

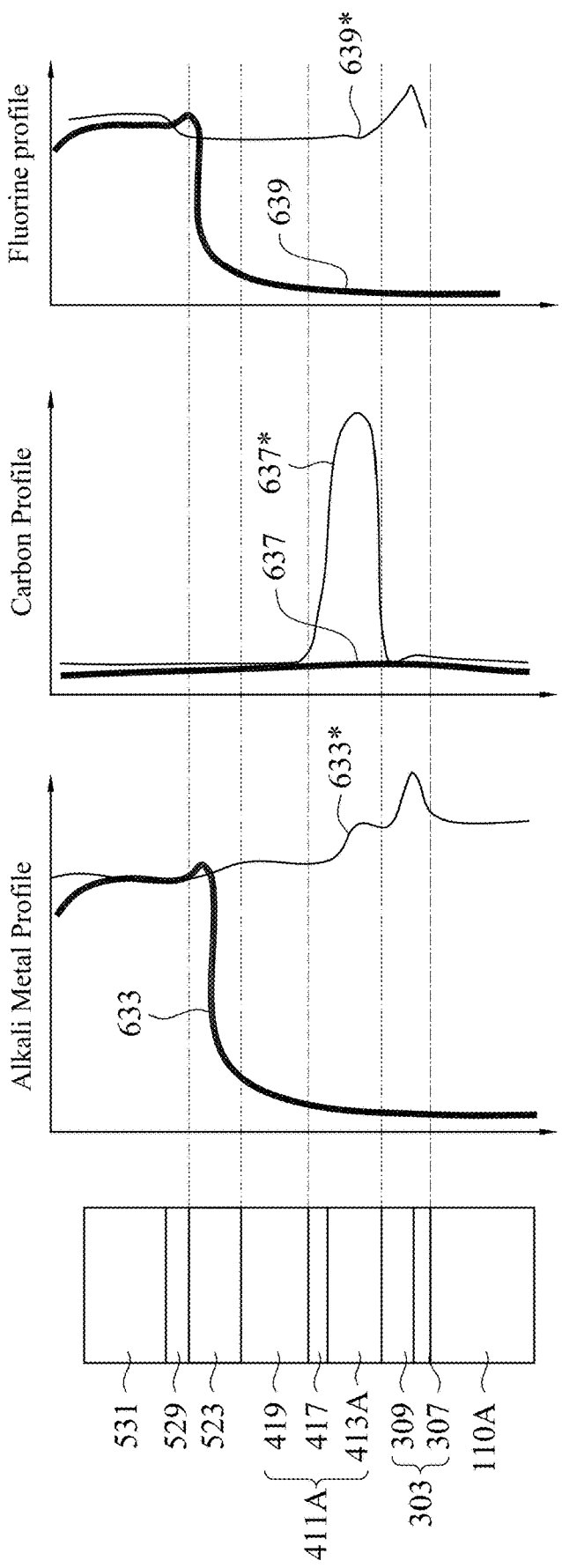

SEMICONDUCTOR DEVICE AND MANUFACTURING METHOD THEREOF

CROSS-REFERENCE TO RELATED APPLICATION

This application is a continuation of U.S. Non-Provisional patent application Ser. No. 17/081,879, filed on Oct. 27, 2020, titled "Semiconductor Device and Manufacturing Method Thereof," which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, and fin field effect transistors (finFETs). Advanced nodes of semiconductor technology also requires use of stringent etch chemicals, films, and also new processes, such as cut metal gate (CMG) processes. Such scaling down, stringent chemicals, and new processes have introduced challenges to improve the performance of semiconductor devices.

BRIEF DESCRIPTION OF THE DRAWINGS

Aspects of the present disclosure are best understood from the following detailed description when read with the accompanying figures.

FIGS. 6A-6D illustrate distributions of alkali metals, carbon, and fluorine in a gate structure of a semiconductor device with a diffusion barrier layer, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
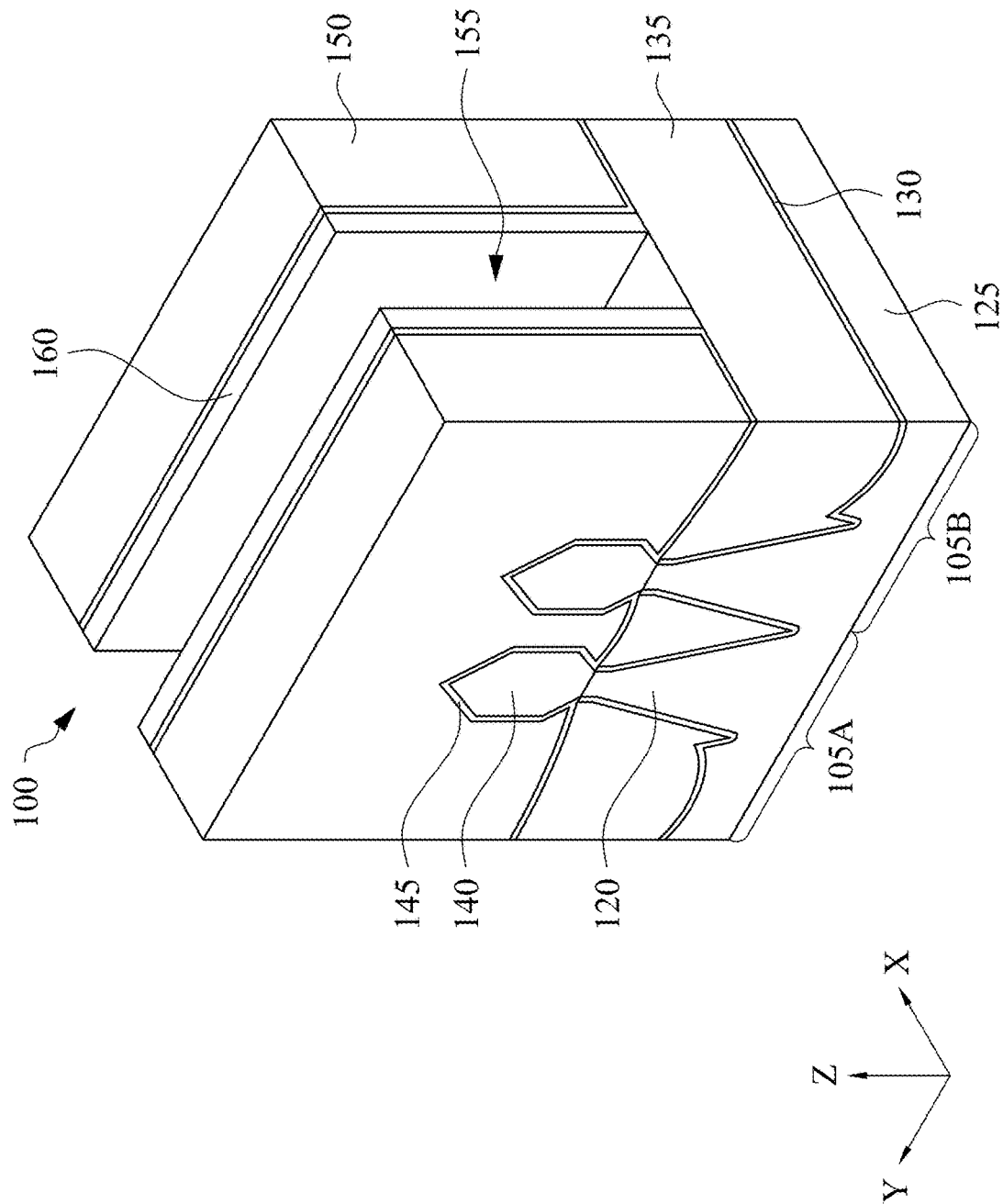
FIGS. 1A, 1B, and 1C illustrate isometric views and a cross-sectional view of a partially-fabricated semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

With increasing demand for lower power consumption, higher performance, and smaller semiconductor devices, dimensions of semiconductor devices continue to scale down. The continuous scaling down of device dimensions and the increasing demand for device performance may require various process and material improvements, which can have multiple challenges. For example, devices may have different work function stacks for multiple threshold voltage ($V_t$), while some of work function layers in the work function stacks may include aluminum carbon (Al—C) compounds and/or other carbon (C) impurities from precursors such as trimethylaluminum (TMA), which includes both aluminum and carbon. The C impurities can include titanium carbon compounds (Ti—C), tantalum carbon compounds (Ta—C), tungsten carbon compounds (W—C), ruthenium carbon compounds (Ru—C), cobalt carbon compounds (Co—C), silicon carbon compounds (Si—C), and molybdenum carbon compounds (Mo—C). The Al—C compounds and other C impurities can have strong interactions with the alkali metals (e.g., lithium (Li), sodium (Na), and potassium (K)), thus attracting the Al—C compounds and other C impurities around gate dielectric layers and channel structures. Advanced nodes of semiconductor technology also require the use of other processes, such as cut metal gate (CMG) processes instead of cut poly processes and associated chemical mechanical polishing (CMP) processes after a refill of CMG openings. Some of the chemicals used in the etching processes and/or the CMP processes may have alkali metals, which can diffuse into gate dielectric layers and channel structures. The alkali metals can increase an oxidation of the work function metal gate layers, gate dielectric layers, and channel materials, causing damage to the work function metal gate layers, gate dielectric layers, and channel structures. For example, different oriented defects (e.g., <111> oriented defects) can form on the channel structure surface around the interface between the gate dielectric layers and channel structures. Channel structures and gate structures can be oxidized, forming humps around the interface and increasing the channel structure surface roughness between the gate dielectric layers and the channel structures. The work function metal gate layers and gate dielectric layers can be damaged and can form discontinuous films around the channel structure. As a result, the threshold voltage and the device performance of the semiconductor devices can be negatively affected.

Various embodiments of the present disclosure provide methods for forming a semiconductor device with a diffusion barrier layer. In some embodiments, a gate dielectric layer of the semiconductor device can be formed on a fin structure. A work function stack can be formed on the gate dielectric layer. A diffusion barrier layer can be formed on the work function stack to block the diffusion of alkali metals (e.g., Li, Na, and K) and other impurities (e.g., fluorine (F) and hydroxyl ions (OH)) to the work function metal gate layers, the gate dielectric layer, and the fin structure. The diffusion barrier layer can isolate the work function stack and the gate dielectric layer from CMG etching gases and/or wet chemicals, thereby avoiding contaminations (e.g., Br, Cl, O, and F) from these chemicals. The diffusion barrier layer can reduce defects around the interface of the gate dielectric layer and the fin structure and improve channel structure surface roughness, thereby improving threshold voltage and device performance. In some embodiments, a glue layer can be formed on the diffusion barrier layer and a metal layer can be formed on the glue layer. In some embodiments, the diffusion barrier layer can also act as a glue layer and a metal layer can be formed on the diffusion barrier layer. In some embodiments, the semiconductor device can have multiple diffusion barrier layers and multiple glue layers to improve the blocking of alkali metals and other impurities. In some embodiments, a capping layer in the work function stack can be treated in an oxygen or a nitrogen environment to form the diffusion barrier layer. In some embodiments, the diffusion barrier layer can be deposited on the work function stack. In some embodiments, the work function stack can be treated in a hydrogen environment to reduce a carbon concentration in the work function layer and thereby reduce the attraction of alkali metals by Al—C compounds and/or other C impurities (e.g., Ti—C, Ta—C, W—C, Ru—C, Co—C, Si—C, and Mo—C) in the work function layer.

Figure 1B:
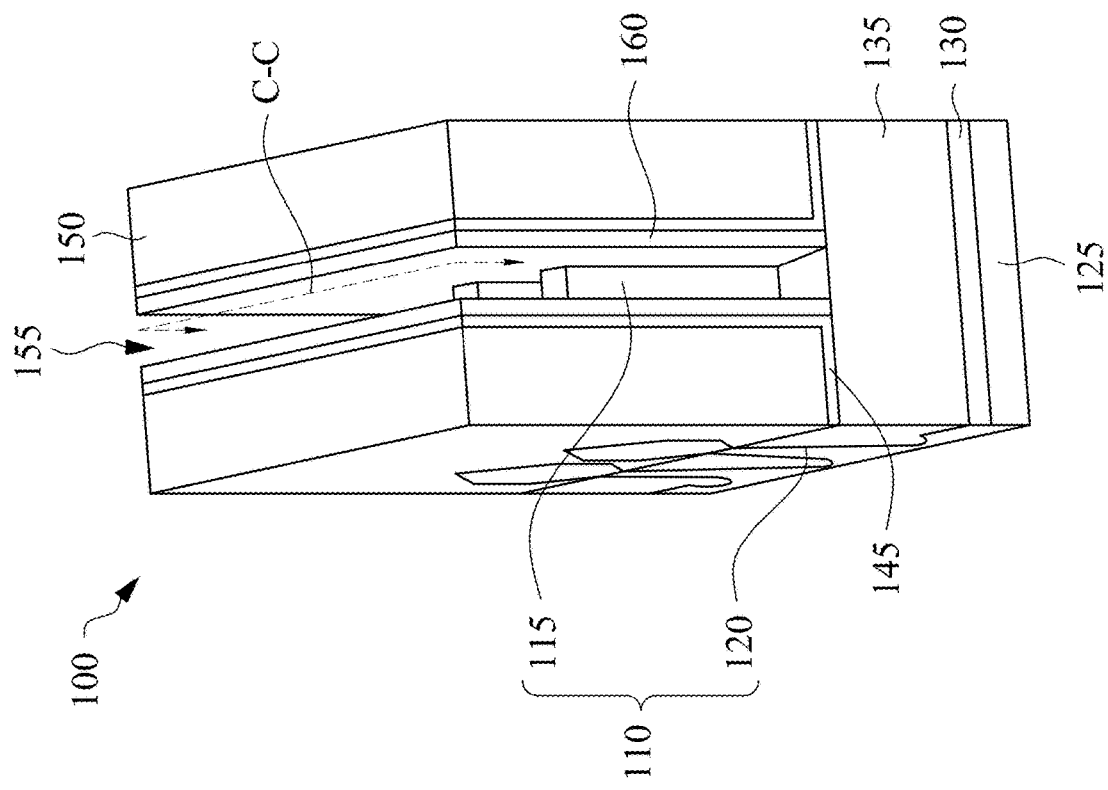
Figure 1C:
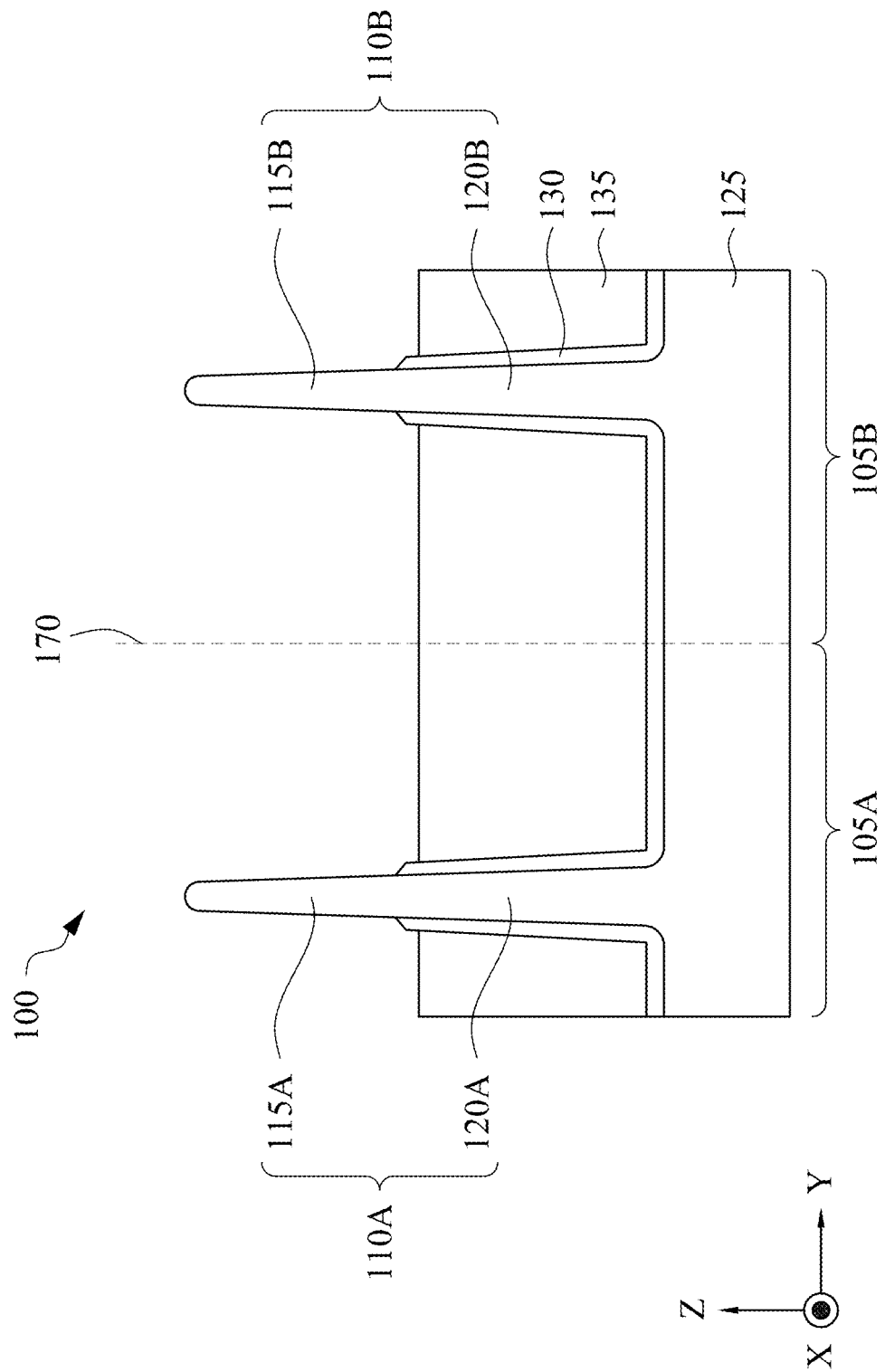

FIGS. 1A and 1B illustrate isometric views of a partially-fabricated semiconductor device 100 after the removal of a sacrificial gate stack, in accordance with some embodiments. In some embodiments, FIG. 1B shows partially-fabricated semiconductor device 100 of FIG. 1A after being rotated clock wise around the Z-axis by about 45 degrees. FIG. 1C illustrates a cross-sectional view along line C-C in FIG. 1B of the partially-fabricated semiconductor device 100, according to some embodiments.

As shown in FIGS. 1A-1C, partially-fabricated semiconductor device 100 includes a FET 105A and a FET 105B formed on a substrate 125. In some embodiments, FETs 105A and 105B can be finFETs, gate-all-around FETs (GAA FETs), planar FETs, or other suitable FET devices. In some embodiments, FETs 105A and 105B can be both p-type FETs (PFETs), both n-type FETs (NFETs), or one of each conductivity type FET. In some embodiments, FET 105A can be an NFET (also referred to as "NFET 105A") and FET 105B can be a PFET (also referred to as "PFET 105B"). Though FIGS. 1A-1C show two FETs, semiconductor device 100 can have any number of FETs. Also, though FIGS. 1A-1C show one gate stack opening 155, semiconductor device 100 can have additional gate stack openings similar and parallel to gate stack opening 155. The discussion of elements of FETs 105A and 105B with the same annotations applies to each other, unless mentioned otherwise.

As shown in FIGS. 1A-1C, FETs 105A and 105B can be formed on substrate 125. In some embodiments, substrate 125 can include a semiconductor material, such as crystalline silicon. In some embodiments, substrate 125 can include (i) an elementary semiconductor, such as germanium (Ge); (ii) a compound semiconductor including silicon carbide (SiC), silicon arsenide (SiAs), gallium arsenide (GaAs), gallium phosphide (GaP), indium phosphide (InP), indium arsenide (InAs), indium antimonide (InSb), and/or a III-V semiconductor material; (iii) an alloy semiconductor including silicon germanium (SiGe), silicon germanium carbide (SiGeC), germanium stannum (GeSn), silicon germanium stannum (SiGeSn), gallium arsenic phosphide (GaAsP), gallium indium phosphide (GaInP), gallium indium arsenide (GaInAs), gallium indium arsenic phosphide (GaInAsP), aluminum indium arsenide (AlInAs), and/or aluminum gallium arsenide (AlGaAs); (iv) a silicon-on-insulator (SOI) structure; (v) a silicon germanium (SiGe)-on insulator structure (SiGeOI); (vi) germanium-on-insulator (GeOI) structure; and (vii) a combination thereof. In some embodiments, substrate 125 can be made from an electrically non-conductive material, such as glass and sapphire. In some embodiments, substrate 125 can be doped with p-type dopants (e.g., boron, indium, aluminum, or gallium) or n-type dopants (e.g., phosphorus or arsenic). For example purposes, substrate 125 will be described in the context of crystalline silicon (Si). Based on the disclosure herein, other materials can be used. These materials are within the spirit and scope of this disclosure.

Referring to FIGS. 1A-1C, semiconductor device 100 can include additional structural elements, such as fin structures 110, a liner 130, an insulating layer 135, source/drain (S/D) epitaxial fin structures 140, an etch stop layer 145, an isolation layer 150, a gate stack opening 155 formed in isolation layer 150, and gate spacers 160 formed on sidewall surfaces of isolation layer 150 in gate stack opening 155.

Fin structures 110A and 110B (also collectively referred to as "fin structures 110") can include fin top portions 115A and 115B (also collectively referred to as "fin top portions 115") and fin bottom portions 120A and 120B (also collectively referred to as "fin bottom portions 120") respectively, as shown in FIGS. 1A-1C. In some embodiments, fin top portions 115 can be a single fin structure. In some embodiments, fin top portions 115 can include a stack of semiconductor layers (e.g., a stack of nanosheets, nanowires, or nano-fork sheets for GAA FETs). In some embodiments, fin top portions 115 can include semiconductor materials similar to or different from fin bottom portions 120. In some embodiments, fin top portions 115 and fin bottom portions 120 can include a semiconductor material the same as substrate 125, such as crystalline Si. In some embodiments, fin top portions 115 can include silicon germanium.

Fin structures 110 may be formed by patterning with any suitable method. For example, fin structures 110 may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. In some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern fin structures 110.

In some embodiments, insulating layer 135 can be an isolation structure, such as a shallow trench isolation (STI), that provides electrical isolation between FETs 105A and 105B from each other and from neighboring FETs with different fin structures (not shown) on substrate 125 and/or neighboring active and passive elements (not shown) integrated with or deposited on substrate 125. In some embodiments, insulating layer 135 can be a layer that functions as an electrical insulator (e.g., a dielectric layer). In some embodiments, insulating layer 135 can include silicon oxide ($SiO_2$), silicon nitride ($Si_3N_4$), silicon oxy-nitride (SiON), fluorine-doped silicate glass (FSG), phosphorous-doped silicate glass (PSG), a low-k dielectric material (e.g., with k-value less than about 3.9), and/or other suitable dielectric materials. In some embodiments, liner 130 is a nitride layer, such as silicon nitride.

Referring to FIGS. 1A-1C, S/D epitaxial fin structures 140 can be disposed on fin bottom portions 120 and abut gate spacers 160, extending along an X-axis within isolation layer 150. In some embodiments, S/D epitaxial fin structures 140 can have any geometric shape, such as a polygon, an ellipsis, and a circle. S/D epitaxial fin structures 140 can include an epitaxially-grown semiconductor material. In some embodiments, the epitaxially-grown semiconductor material includes the same material as substrate 125. In some embodiments, the epitaxially-grown semiconductor material includes a different material from substrate 125. In some embodiments, the epitaxially-grown semiconductor material for each of S/D epitaxial fin structures 140 can be the same as or different from each other. The epitaxially-grown semiconductor material can include: (i) a semiconductor material, such as germanium and silicon; (ii) a compound semiconductor material, such as gallium arsenide and aluminum gallium arsenide; and (iii) a semiconductor alloy, such as silicon germanium and gallium arsenide phosphide.

In some embodiments, S/D epitaxial fin structures 140 can be p-type for a PFET and n-type for an NFET. In some embodiments, p-type S/D epitaxial fin structures 140 can include SiGe and can be in-situ doped during an epitaxial growth process using p-type dopants, such as boron, indium, and gallium. In some embodiments, p-type S/D epitaxial fin structures 140 can have multiple sub-regions that can include SiGe and can differ from each other based on, for example, doping concentrations, epitaxial growth process conditions, and/or a relative concentration of Ge with respect to Si. In some embodiments, n-type S/D epitaxial fin structures 140 can include Si and can be in-situ doped during an epitaxial growth process using n-type dopants, such as phosphorus and arsenic. In some embodiments, n-type S/D epitaxial fin structures 140 can have multiple n-type epitaxial fin sub-regions that can differ from each other based on, for example, doping concentration and/or epitaxial growth process conditions.

Referring to FIGS. 1A-1C, fin structures 110A-110B can be current-carrying channel structures for respective FETs 105A and 105B. Channel regions of FETs 105A and 105B can be formed in portions of their respective fin top portions 115A and 115B in gate stack opening 155. S/D epitaxial fin structures 140 can function as S/D regions of respective FETs 105A and 105B.

Referring to FIGS. 1A-1C, etch stop layer 145 can extend over insulating layer 135, S/D epitaxial fin structures 140, and gate spacers 160. In some embodiments, etch stop layer 145 can function as a layer to stop etch in a subsequent etching process during the formation of S/D contact openings on S/D epitaxial fin structures 140. In some embodiments, etch stop layer 145 can be deposited by a conformal deposition process, such as atomic layer deposition (ALD), plasma-enhanced ALD (PEALD), chemical vapor deposition (CVD), plasma-enhanced CVD (PECVD), and any other suitable deposition method.

Isolation layer 150 can surround S/D epitaxial fin structures 140 and can be formed prior to the formation of gate stack opening 155. After the removal of sacrificial gate stacks (not shown), gate stack opening 155 can be formed in isolation layer 150, as shown in FIGS. 1A and 1B. In some embodiments, isolation layer 150 can be an interlayer dielectric (ILD) that includes a silicon oxide-based dielectric material with or without carbon and/or nitrogen. In some embodiments, isolation layer 150 can be deposited by CVD, physical vapor deposition (PVD), or any other suitable deposition method.

Gate spacers 160 can be a stack of one or more layers that include the same or different materials. In some embodiments, gate spacers 160 can include a dielectric material, such as silicon oxynitride (SiON), silicon carbon nitride (SiCN,), silicon oxycarbide (SiOC), silicon nitride, and a combination thereof. According to some embodiments, gate spacers 160 can be deposited on sidewall surfaces of sacrificial gate stacks, which are later removed during a gate replacement process to form gate stack opening 155. In FIGS. 1A-1C, gate spacers 160 function as structural elements for the metal gate stack to be formed in gate stack opening 155 in subsequent processes.

Referring to FIG. 1C, semiconductor device 100 can further include boundary 170 between FETs 105A and 105B. Boundary 170 can be a boundary where gate dielectric layers of FET 105B border gate dielectric layers of FETs 105A, such as a high-k dielectric layer boundary between FET 105A and FET 105B. In some embodiments, boundary 170 can be between fin structures 110A and 110B. In some embodiments, a diffusion barrier layer can be formed on FETs 105A-105B and boundary 170. Fabrication processes of semiconductor device 100 with a diffusion barrier layer are described in FIGS. 3A-3B, 4, and 5A-5C. The fabrication processes also apply to the diffusion barrier layer formed at boundary 170, unless mentioned otherwise.

Figure 2:
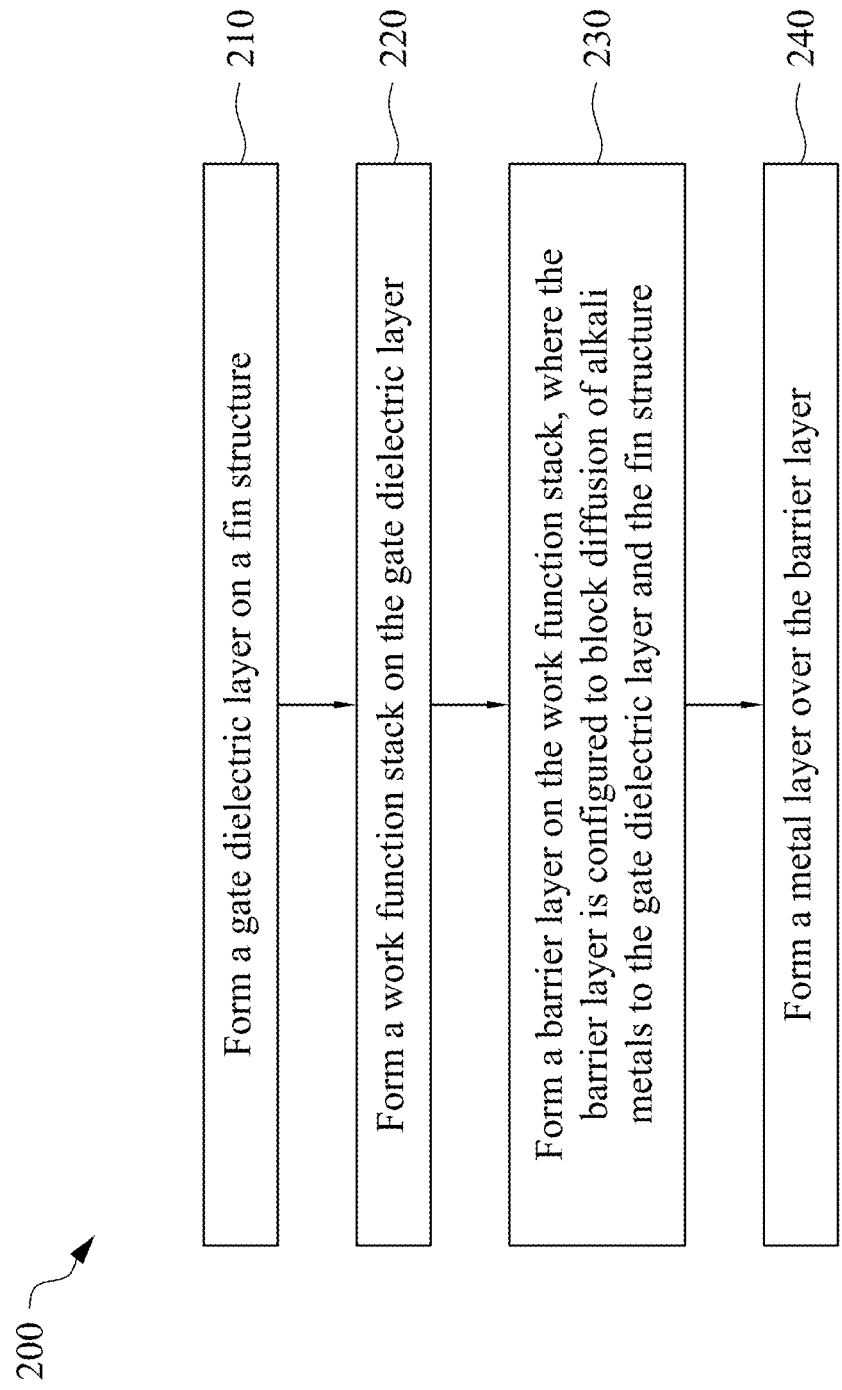
FIG. 2 is a flow diagram of a method for fabricating a semiconductor device with a diffusion barrier layer, in accordance with some embodiments.

FIG. 2 is a flow diagram of method 200 for fabricating a semiconductor device with a diffusion barrier layer, according to some embodiments. Method 200 may not be limited to finFET devices and can be applicable to devices that would benefit from the diffusion barrier layer, such as planar FETs and GAA FETs. Additional fabrication operations may be performed between various operations of method 200 and may be omitted merely for clarity and ease of description. Additional processes can be provided before, during, and/or after method 200; one or more of these additional processes are briefly described herein. Moreover, not all operations may be needed to perform the disclosure provided herein. Additionally, some of the operations may be performed simultaneously or in a different order than shown in FIG. 2. In some embodiments, one or more other operations may be performed in addition to or in place of the presently described operations.

For illustrative purposes, the operations illustrated in FIG. 2 will be described with reference to the example fabrication process for fabricating semiconductor device 100 with a diffusion barrier layer as illustrated in FIGS. 3A-3B, 4, and 5A-5C. These figures illustrate partial cross-sectional views along a Y-axis of semiconductor device 100 with a diffusion barrier layer 523 at various stages of its fabrication process, in accordance with some embodiments. Although FIGS. 3A-3B, 4, and 5A-5C illustrate diffusion barrier layer 523 for semiconductor device 100, method 200 can be applied to other semiconductor devices, such as planar FETs, finFETs, and GAA FETs. Elements in FIGS. 3A-3B, 4, and 5A-5C with the same annotations as elements in FIGS. 1A-1C are described above.

Figure 3A:
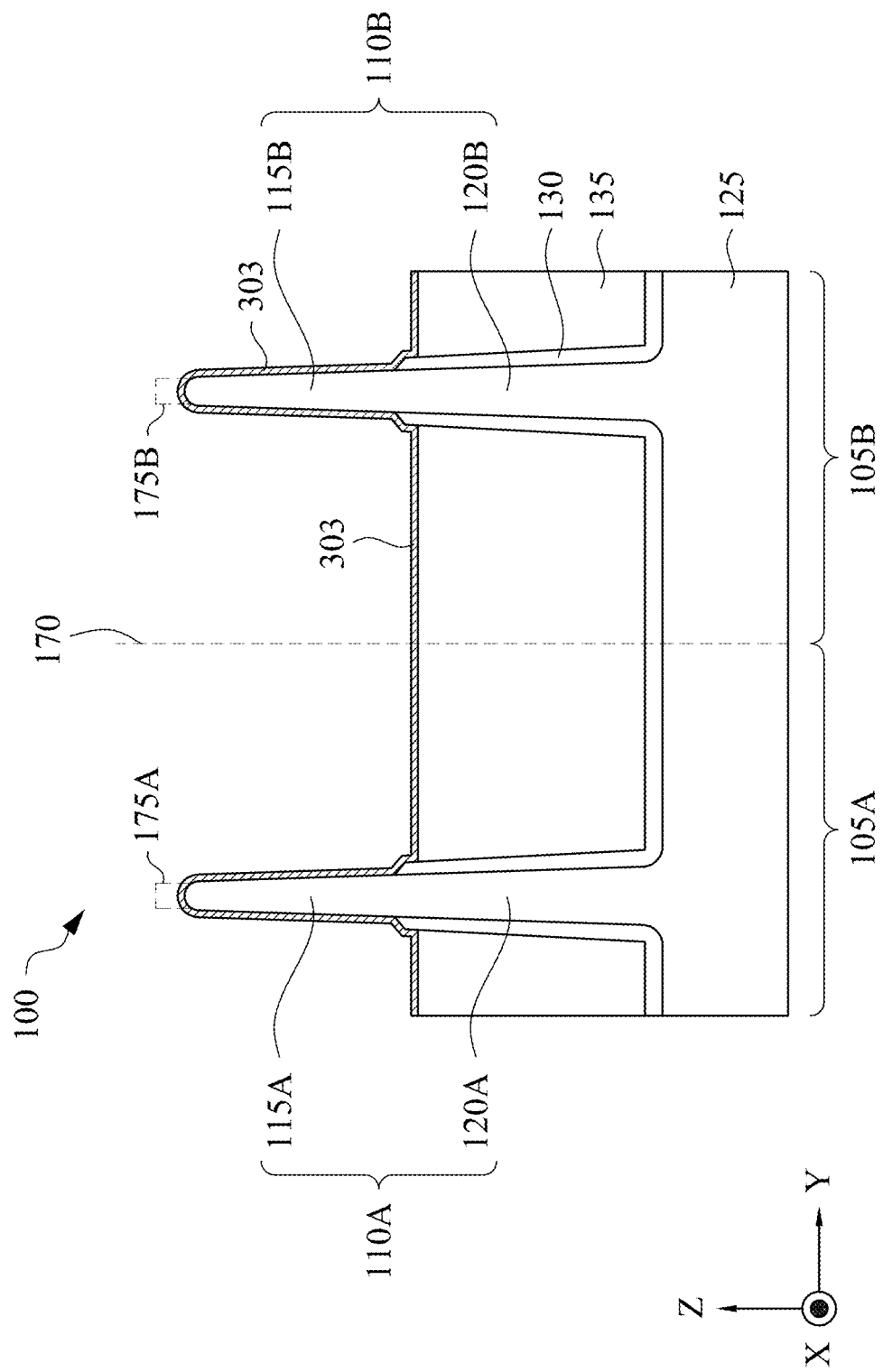
FIGS. 3A-3B, 4, and 5A-5C illustrate various cross-sectional views of a semiconductor device with a diffusion barrier layer at various stages of its fabrication process, in accordance with some embodiments.
Figure 3B:
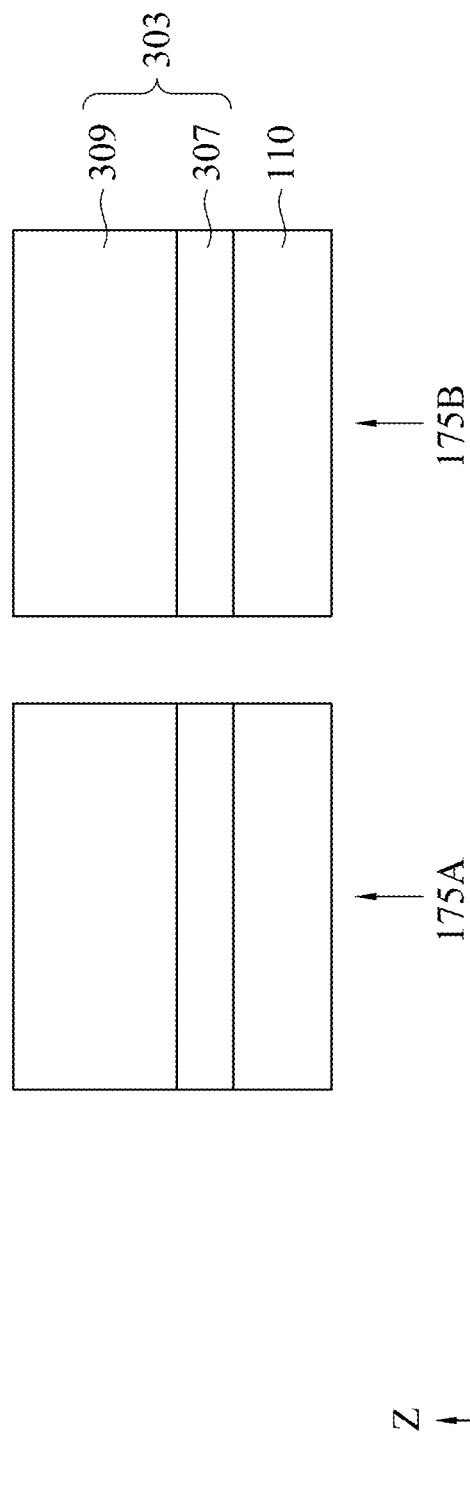

Referring to FIG. 2, method 200 begins with operation 210 and the process of forming a gate dielectric layer 303 on fin structures 110A-110B and on insulating layer 135 between fin structures 110A-110B within gate stack opening 155 shown in FIGS. 1A-1C. According to some embodiments, FIG. 3A is a cross-sectional view of semiconductor device 100 shown in FIG. 1C after operation 210 of method 200, and FIG. 3B is an enlarged cross-sectional view of regions 175A-175B of semiconductor device 100 shown in FIG. 3A. Gate dielectric layer 303 can include a high-k dielectric layer 309 and an interfacial layer 307. Regions 175A-175B can represent the gate structures formed on fin structures 110A-110B, respectively. In some embodiments, the gate structures formed on fin structures 110A-110B in FIGS. 3A and 3B can represent the gate structures formed on insulating layer 135 of FETs 105A and 105B, respectively.

As shown in FIGS. 3A and 3B, gate dielectric layer 303 can be formed on fin structures 110 and insulating layer 135. In some embodiments, gate dielectric layer 303 can be a gate dielectric stack that includes interfacial layer 307 and high-k dielectric layer 309. In some embodiments, interfacial layer 307 can be formed by exposing the surfaces of fin structures 110 to an oxidizing ambient. In some embodiments, the oxidizing ambient can include a combination of ozone ($O_3$), ammonia hydroxide/hydrogen peroxide/water mixture (SC1), and hydrochloric acid/hydrogen peroxide/water mixture (SC2). As a result of the aforementioned oxidation process, a silicon oxide or silicon germanium oxide layer between about 5 Å and about 20 Å can be formed on exposed surfaces, such as the surfaces of fin structures 110 in gate stack opening 155, but not on insulating layer 135. Therefore, gate dielectric layer 303 on fin structures 110 can include interfacial layer 307 and high-k dielectric layer 309, and gate dielectric layer 303 on insulating layer 135 can include only high-k dielectric layer 309, according to some embodiments. In some embodiments, interfacial layer 307 can include a silicon oxide or silicon germanium oxide layer with a thickness from about 5 Å to about 20 Å and deposited by ALD, CVD, or any other suitable deposition method. As a result of the deposition process, the silicon oxide layer can cover fin structures 110 and insulating layer 135. In some embodiments, high-k dielectric layer 309 can include a dielectric material with a dielectric constant (k-value) higher than about 3.9. In some embodiments, high-k dielectric layer 309 can include hafnium oxide, aluminum oxide, zirconium oxide, lanthanum oxide, or other suitable high-k dielectric materials deposited by ALD, CVD, or PEALD with a thickness from about 10 Å to about 50 Å.

Figure 4:
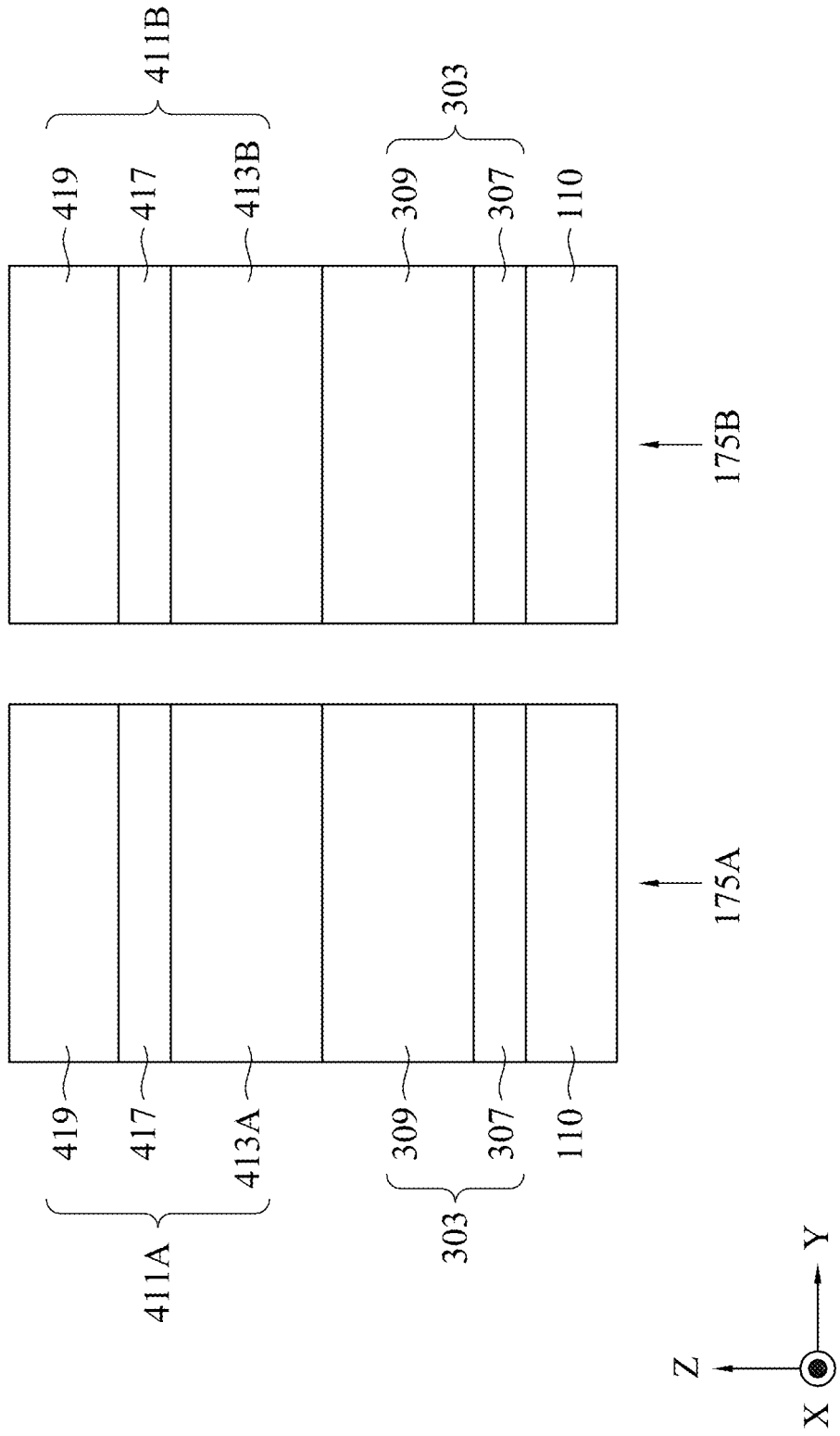

Referring to FIG. 2, method 200 continues with operation 220 and the process of forming a work function stack on the gate dielectric layer. As shown in FIG. 4, work function stacks 411A-411B can be formed on gate dielectric layer 303 at regions 175A-175B, respectively. In some embodiments, the formation of work function stacks 411A-411B can include the formation of a stack of work function layers. As shown in FIG. 4, the formation of work function stack 411A can include the formation of an n-type work function layer 413A, a shield layer 417, and a capping layer 419 for NFET 105A. The formation of work function stack 411B can include the formation of a p-type work function layer 413B, shield layer 417, and capping layer 419 for PFET 105B. In some embodiments, work function layers 413A-413B can be deposited with an atomic layer deposition (ALD) process at a deposition temperature between about 300° C. and about 550° C. In some embodiments, work function layers 413A-413B can have a thickness ranging from about 10 Å to about 600 Å. In some embodiments, a crystallinity of work function layers 413A-413B can range from about 65% to about 100%.

In some embodiments, work function layers 413A-413B can have a stacked of layers and can include titanium nitride (TiN), ruthenium (Ru), or aluminum and/or titanium (e.g., in the form of titanium aluminum (TiAl), titanium aluminum carbon (TiAlC), tantalum aluminum (TaAl), or tantalum aluminum carbon (TaAlC)). According to some embodiments, work function layers 413A-413B can have aluminum-carbon (Al—C) compounds and/or other C impurities (e.g., Ti—C, Ta—C, W—C, Ru—C, Co—C, Si—C, and Mo—C) from deposition precursors. Al—C compounds and/or other C impurities in work function layers 413A-413B can have strong interaction with the alkali metals (e.g., Li, Na, and K) and thereby can attract the alkali metals (e.g., Li, Na, and K) and other impurities (e.g., F and OH) during subsequent processes (e.g., etching processes and CMG processes). In some embodiments, the alkali metals and other impurities can increase the oxidation of work function layers 413A-413B, gate dielectric layer 303, and fin structures 110 and form defects around the interface, causing damage to work function layers 413A-413B, gate dielectric layer 303, and channel surfaces of fin structures 110. In some embodiments, the hydroxyl ions can damage gate dielectric layer 303 by forming metal hydroxides. For example, hydroxyl ions can convert lanthanum oxide to lanthanum hydroxide, which has a lower k-value, thereby degrading device performance.

The deposition of work function layers 413A-413B can be followed by depositing shield layer 417, as shown in FIG. 4. In some embodiments, shield layer 417 can include intrinsic TiN (iTiN), tungsten nitride (WN), tantalum nitride (TaN), or other suitable materials to allow patterning of work function layers 413A-413B and protect work function layers 413A-413B from contamination and damage in subsequent processes, such as BARC contamination and plasma damage from removing a hard mask layer. In some embodiments, shield layer 417 can have a thickness ranging from about 5 Å to about 60 Å.

The deposition of shield layer 417 can be flowed by depositing capping layer 419. Capping layer 419 can be deposited on shield layer 417, as shown in FIG. 4. In some embodiments, capping layer 419 can include Si formed by a silane ($SiH_4$) or disilane ($Si_2H_6$) soak process at a temperature ranging from about 250° C. to about 500° C. In some embodiments, capping layer 419 can include SiTi formed by an ALD or plasma-enhanced ALD (PEALD) process with titanium tetrachloride ($TiCl_4$) and $SiH_4$ precursors. In some embodiments, capping layer 419 can include Si and have a thickness ranging from about 10 Å to about 60 Å.

In some embodiments, the deposition of capping layer 419 can be followed by a hydrogen treatment. The hydrogen treatment can be performed in a hydrogen environment with hydrogen gas or hydrogen free radical for about 10 s to about 100 s at a temperature ranging from about 300° C. to about 500° C. In some embodiments, the hydrogen treatment can reduce the Al—C compounds in work function layers 413A-413B. In some embodiments, the hydrogen treatment can reduce a carbon concentration in work function layers 413A-413B and thereby reduce the attracting of alkali metals (e.g., Li, Na, and K) by work function layers 413A-413B during subsequent processes. As a result, the hydrogen treatment can also be referred to as a "decarburization process." In some embodiments, the carbon concentration of work function layers 413A-413B before the hydrogen treatment can be higher than about 13 atomic percent. After the hydrogen treatment, the carbon concentration in work function layers 413A-413B can be reduced to less than about 2 atomic percent, thereby reducing the diffusion of alkali metals.

Figure 5A:
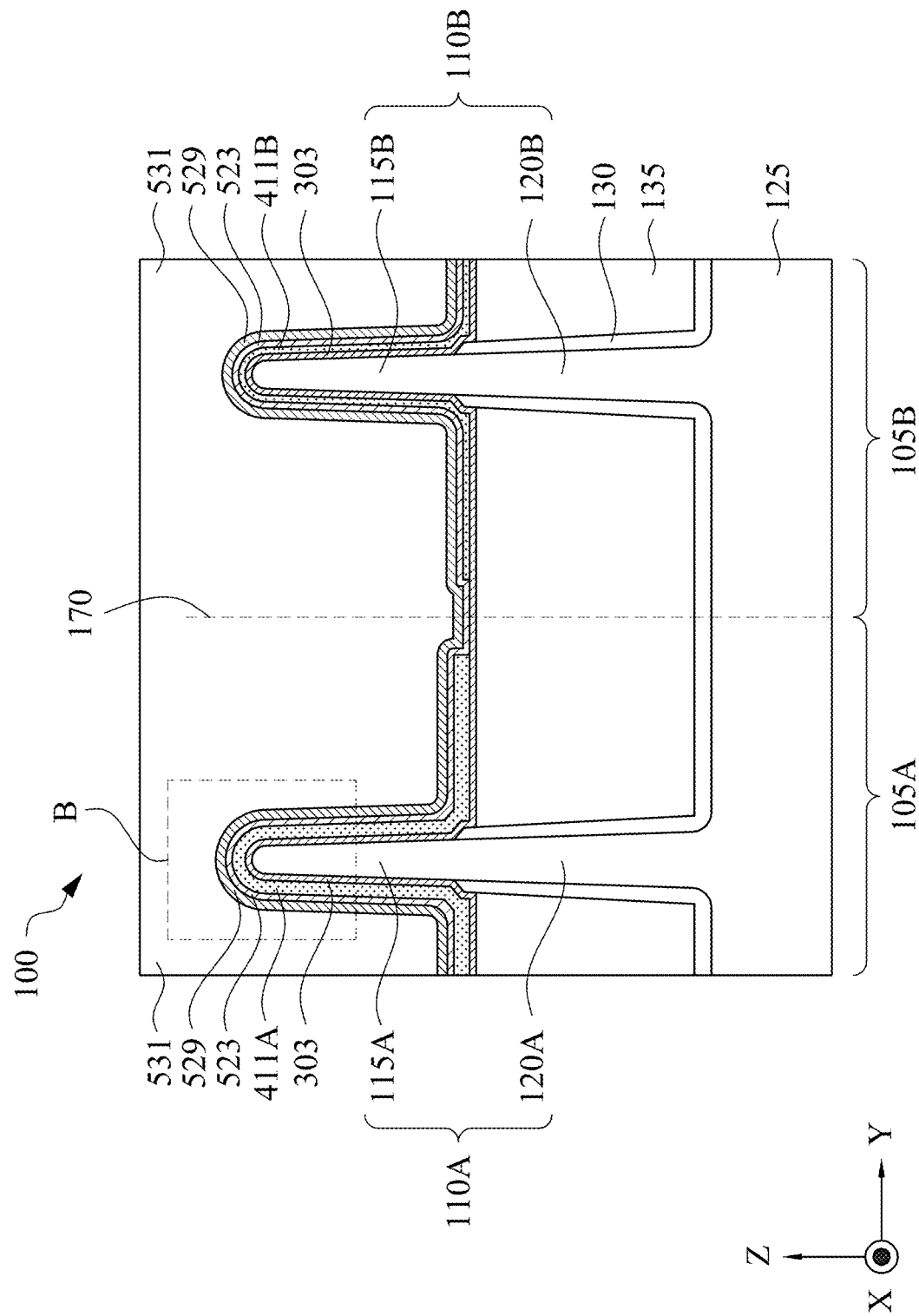
Figure 5C:
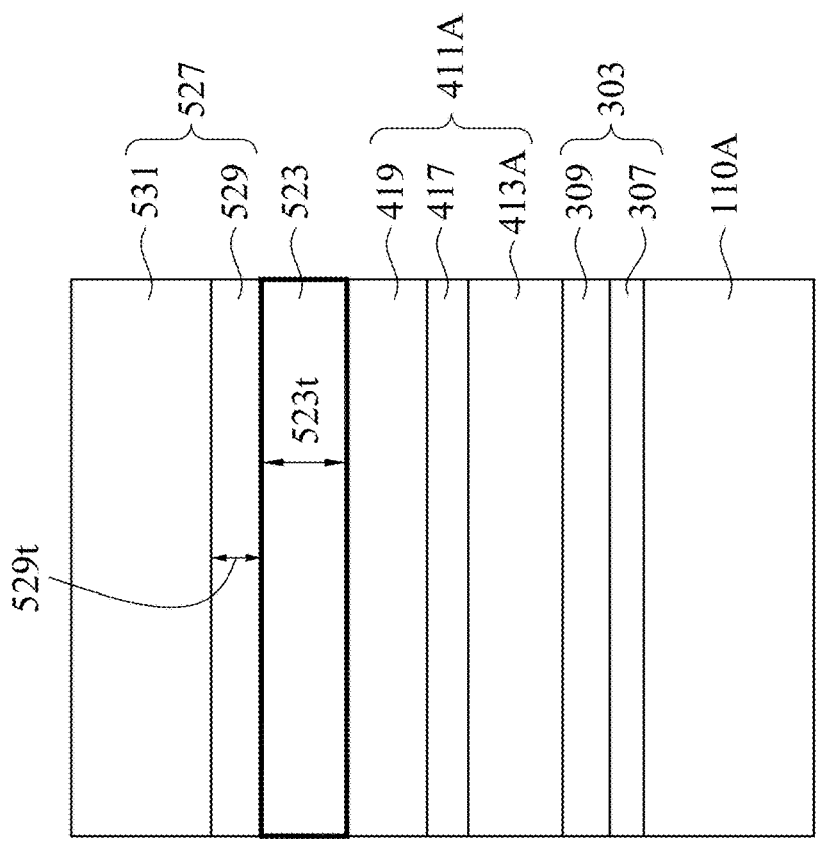
Figure 5B:
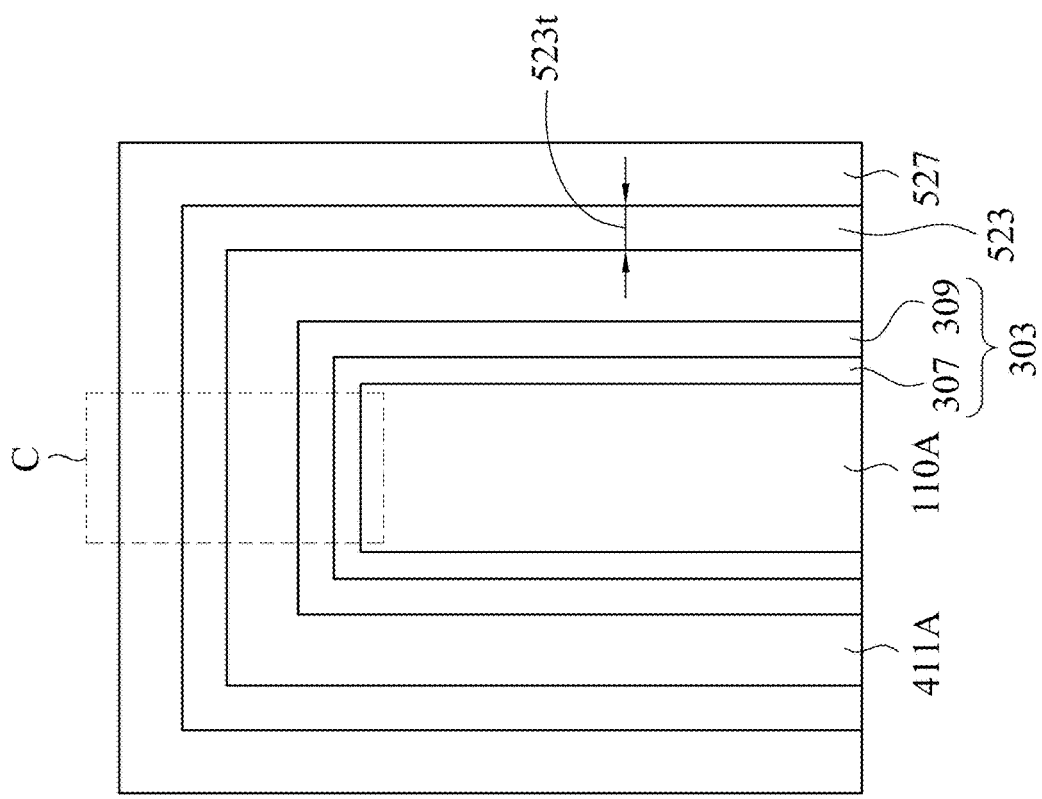

Referring to FIG. 2, method 200 continues with operation 230 and the process of forming a barrier layer on the work function stack. The diffusion barrier layer can be configured to block the diffusion of alkali metals (e.g., Li, Na, and K) and other impurities (e.g., F and OH) to the work function metal gate layers, the gate dielectric layer, and the fin structures in subsequent processes. As shown in FIG. 5A-5C, diffusion barrier layer 523 can be formed on work function stacks 411A-411B of FETs 105A and 105B. FIG. 5B illustrates an enlarged view of region B in FIG. 5A, according to some embodiments. FIG. 5C illustrates an enlarged view of region C in FIG. 5B, according to some embodiments. Though FIGS. 5B and 5C show a cross-sectional view of diffusion barrier layer 523, glue layer 529, and metal layer 531 of FET 105A, the discussion of these layers applies to FET 105B.

In some embodiments, diffusion barrier layer 523 can be deposited by ALD, PEALD, chemical vapor deposition (CVD), physical vapor deposition (PVD), and other suitable deposition method at a temperature ranging from about 150° C. to about 600° C. In some embodiments, diffusion barrier layer 523 can include tin oxide ($SnO_2$), zinc oxide (ZnO), manganese oxide (MnO), molybdenum oxide ($MoO_3$), molybdenum disulfide ($MoS_2$), zinc sulfide (ZnS), tungsten disulfide ($WS_2$), tungsten diselenide ($WSe_2$), niobium diselenide ($NbSe_2$), vanadium oxide ($VO_2$), vanadium sulfide ($VS_2$), chromium oxide ($CrO_2$), chromium sulfide ($CrS_2$), titanium silicon nitride (TiSiN), titanium carbon nitride (TiCN), tantalum titanium nitride (TaTiN), tungsten titanium nitride (WTiN), tantalum silicon nitride (TaSiN), tungsten silicon nitride (WSiN), silicon nitride (SiN), vanadium nitride (VN), silicon oxynitride (SiON), titanium oxide ($TiO_x$), silicon oxide ($SiO_x$), aluminum oxide ($AlO_x$), or zirconium oxide ($ZrO_x$). The precursors to deposit diffusion barrier layer 523 can include $TiCl_4$, Tetrakis(dimethylamido)titanium (TDMAT), tungsten chloride ($WCl_5$), tungsten fluoride ($WF_6$), Bis(tert-butylimino)bis(dimethylamino) tungsten (BTBDMW), $SiH_4$, $Si_2H_6$, $ZrCl_4$, Tri ethyl aluminum, Tri methyl aluminum, diethylzinc, dimethylzinc, zinc acetate ($Zn(CH_3COO)_2$), bis(ethylcyclopentadienyl)manganese ($Mn(CpEt)_2$), molybdenum hexacarbonyl ($Mo(CO)_6$), tetrakis-dimethyl-amine tin (TDMASn), $MoO_3$, ammonia ($NH_3$), sulfur power (S), selenide powder (Se), hydrogen sulfide ($H_2S$), water vapor ($H_2O$), ozone ($O_3$), and oxygen ($O_2$).

In some embodiments, diffusion barrier layer 523 can be formed by annealing capping layer 419 in an oxygen or a nitrogen environment (e.g., $O_2$, $NH_3$, hydrogen ($H_2$), argon (Ar), and nitrogen ($N_2$)) at a temperature ranging from about 200° C. to about 700° C. for about 10 s to about 100 s. In some embodiments, diffusion barrier layer 523 can be formed by a wet chemical oxidation process using hydrogen peroxide ($H_2O_2$), ammonium hydroxide ($NH_4OH$), hydrogen fluoride acid (HF), or ozonized ($O_3$) deionized (DI) water. In some embodiments, diffusion barrier layer 523 can be formed by a remote plasma treatment with an oxygen plasma or a nitrogen plasma.

In some embodiments, diffusion barrier layer 523 can have a thickness 523t ranging from about 3 Å to about 80 Å. If thickness 523t is less than about 3 Å, diffusion barrier layer 523 may not block the diffusion of alkali metals (e.g., Na, Li, and K) and other impurities (e.g., F and OH) to gate dielectric layer 303 and fin structures 110 in subsequent processes. If thickness 523t is greater than about 80 Å, the blocking effect of diffusion barrier layer 523 may saturate and the cost of diffusion barrier layer 523 may increase. In addition, diffusion barrier layer 523 may not fill gate stack opening 155 shown in FIGS. 1A-1B if thickness 523t is greater than about 80 Å. In some embodiments, diffusion barrier layer 523 can be amorphous or partly crystalline with a crystallinity less than about 35%. If the crystallinity is greater than about 35%, diffusion barrier layer 523 may not effectively block the diffusion of alkali metals (e.g., Li, Na, and K) and other impurities (e.g., F and OH) to gate dielectric layer 303 and fin structures 110 in subsequent processes. In some embodiments, diffusion barrier layer 523 may have a density higher than about 5.1 gram per cubic centimeter (g/cc). If the density is less than about 5.1 g/cc, diffusion barrier layer 523 may not block the diffusion of alkali metals (e.g., Li, Na, and K) and other impurities (e.g., F and OH) to gate dielectric layer 303 and fin structures 110 in subsequent processes.

Referring to FIG. 2, method 200 continues with operation 240 and the process of forming a metal layer over the barrier layer. As shown in FIG. 5A-5C, metal layer 531 can be formed over diffusion barrier layer 523. In some embodiments, glue layer 529 can be formed on diffusion barrier layer 523, and metal layer 531 can be formed on glue layer 529. In some embodiments, diffusion barrier layer 523 can include TiSiN, VN, $WSe_2$, and $NbSe_2$, or other suitable materials and can act as a glue layer. As a result, metal layer 531 can be formed on diffusion barrier layer 523. In some embodiments, glue layer 529 can include Ti, TiN, or TiSiN deposited by an ALD or PEALD process with $TiCl_4$, $SiH_4$, and $NH_3$ precursors. In some embodiments, glue layer 529 can include Co deposited by an ALD process with a Co-based precursor (e.g., dicobalt hexacarbonyl Tert-ButylAcetylene (CCCTBA) and $H_2$). In some embodiments, glue layer 529 can have a thickness 529t ranging from about 10 Å to about 100 Å. In some embodiments, a crystallinity of glue layer 529 can range from about 65% to about 100%.

In some embodiments, metal layer 531 can fill gate stack opening 155 shown in FIGS. 1A-1B and can include tungsten (W) or tungsten fluoride (WF) deposited by an ALD or CVD process with a W-based precursor. In some embodiments, metal layer 531 and glue layer 529 can be referred to as "metal fill 527." In some embodiments, a polishing process, such as chemical mechanical polishing (CMP), can follow the deposition process to coplanarize the top surfaces of metal layer 531, isolation layer 150, and gate spacers 160. In some embodiments, the polishing process can include etching chemicals, such as fluorine-based etchants and alkali metal-based etchants. Without diffusion barrier layer 523, these etching chemicals can damage the gate structures over fin structures 110 and form defects around the surfaces of fin structure 110.

The formation of metal layer 531 can be followed by the formation of cut metal gate (CMG) openings. In some embodiments, gate structures formed on FETs 105A and 105B can include gate dielectric layer 303, work function stacks 411A-411B, barrier layer 523, and metal fill 527. The gate structures can extend over other FETs in addition to FETs 105A and 105B. In some embodiments, a patterning process can cut longer gate structures to shorter sections according to the desired layout. This process can be referred to as cut metal gate (CMG) process. An etching process can remove portions of the gate structures and form opening between different shorter sections of the longer gate structures. In some embodiments, the etching process can include a direction dry etching process. In some embodiments, the etching process can include several etching operations with each having appropriate etching gas chemistries for different layers. The etching process can include using stringent etch chemicals, such as chlorine-based etchants and alkali metal-based etchants. Without diffusion barrier layer 523, these etching chemicals can damage the gate structures over fin structures 110 and form defects around the surfaces of fin structure 110.

The formation of CMG openings can be followed by refill of the CMG openings. In some embodiments, a dielectric material, such as silicon oxide and silicon nitride, can be blanket deposited to refill the CMG openings. In some embodiments, the refill of the CMG openings can be followed by a planarization process. The planarization process can include a CMP process to coplanarize top surfaces of the gate structures and the refilled dielectric material. In some embodiments, the CMP process can include etching chemicals, such as fluorine-based etchants and alkali metal-based etchants. Without diffusion barrier layer 523, these etching chemicals can damage the gate structures over fin structures 110 and form defects around the surfaces of fin structure 110. Diffusion barrier layer 523 can isolate work function stacks 411A-411B and gate dielectric layer 303 from CMG etching chemicals and CMP etching chemicals, thereby preventing contaminations (e.g., Br, Cl, O, and F) from these chemicals.

With diffusion barrier layer 523, alkali metals (e.g., Li, Na, and K) and other impurities (e.g., F and OH) in subsequent processes (e.g., CMG processes and associated CMP processes) may not diffuse to gate dielectric layer 303 and fin structures 110. FIGS. 6B-6D illustrate alkali metals, carbon, and fluorine concentrations respectively with and without diffusion barrier layer 523 corresponding to different layers of FET 105A in FIG. 6A, according to some embodiments. As shown in FIG. 6B, profile 633* can illustrate the concentration of alkali metals (e.g., Na or K) in corresponding layers of FET 105A without a diffusion barrier layer and profile 633 can illustrate the concentration of alkali metals (e.g., Na or K) in corresponding layers of FET 105A with diffusion barrier layer 523. Compared to a FET without a diffusion barrier layer, FET 105A with diffusion barrier layer 523 can have a lower concentration of alkali metals (e.g., Na or K) in work function stack 411A, gate dielectric layer 303, and fin structures 110. In some embodiments, for FET 105A with diffusion barrier layer 523, the Na concentration in work function stack 411A, gate dielectric layer 303, and fin structures 110 can be less than about $5 \times 10^{15}$ atoms/$cm^{-3}$. The K concentration in work function stack 411A, gate dielectric layer 303, and fin structures 110 can be less than about $1 \times 10^{18}$ atoms/$cm^{-3}$. If the Na concentration is greater than about $5 \times 10^{15}$ atoms/$cm^{-3}$ or the K concentration is greater than about $1 \times 10^{18}$ atoms/$cm^{-3}$, gate dielectric layer 303 and fin structures 110 may have enhanced oxidation and hydroxylation, defects may be formed around the interface, and work function layers 413A-413B, gate dielectric layer 303, and fin structures 110 may be damaged.

As shown in FIG. 6C, profile 637* can illustrate the carbon concentration in corresponding layers of a FET without a diffusion barrier layer. Profile 637 can illustrate the carbon concentration in corresponding layers of FET 105A with diffusion barrier layer 523. Compared to the FET without a diffusion barrier layer, FET 105A with diffusion barrier layer 523 can have a lower carbon concentration, especially in work function layer 413A. In some embodiments, for FET 105A with diffusion barrier layer 523, the carbon concentration in work function layer 413A can be less than about 2 atomic percent. If the carbon concentration is greater than about 2 atomic percent, the Al—C compounds in work function layer 413A can attract more alkali metals. As a result, the Na, Li and K concentrations in work function stack 411A, gate dielectric layer 303, and fin structures 110 can be increased.

As shown in FIG. 6D, profile 639* can illustrate the fluorine concentration in corresponding layers of a FET without a diffusion barrier layer. Profile 639 can illustrate the fluorine concentration in corresponding layers of FET 105A with diffusion barrier layer 523. Compared to the FET without a diffusion barrier layer, FET 105A with diffusion barrier layer 523 can have a lower fluorine concentration in work function stack 411A, gate dielectric layer 303, and fin structures 110. In some embodiments, for FET 105A with diffusion barrier layer 523, the fluorine concentration in work function layer 413A can be less than about $1 \times 10^{18}$ atoms/$cm^{-3}$. If the fluorine concentration is greater than about $1 \times 10^{18}$ atoms/$cm^{-3}$, gate dielectric layer 303 and fin structures 110 may be damaged.

In some embodiments, with diffusion barrier layer 523, <111> oriented defects may not form on the surface of fin structures 110. As a result, channel structure surface roughness can be improved. For example, comparted to FETs without a diffusion barrier layer, FET 105A with diffusion barrier layer 523 can have <100> and <110> face orientations and may not have a <111> face orientation for surfaces of fin structures 110 at the interface of gate dielectric layer 303 and fin structures 110. In addition, work function layers 413A-413B, gate dielectric layer 303, and fin structures 110 may have no humps, and the surface roughness around the interface can be less than about 0.3 nm (e.g., root mean square (RMS) value can be less than about 0.3 nm). Gate dielectric layer 303 and work function stacks 411A-411B can be smooth and consistent, with less than about 1 atomic percent variation within each layer around the surface of fin structures 110.

Figure 7B:
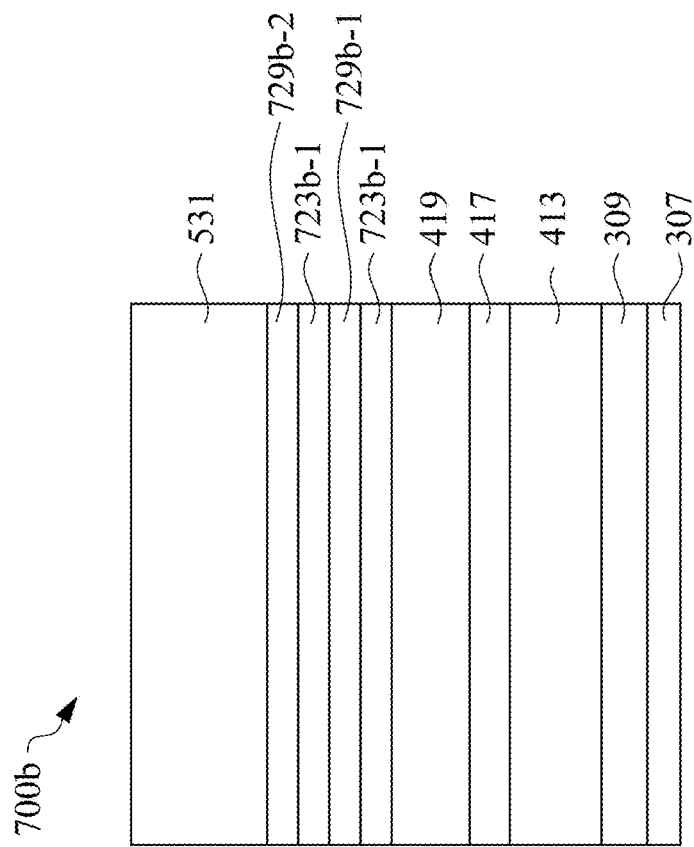
FIGS. 7A-7D illustrate various embodiments of semiconductor devices with diffusion barrier layers to block alkali metals, in accordance with some embodiments.
Figure 7A:
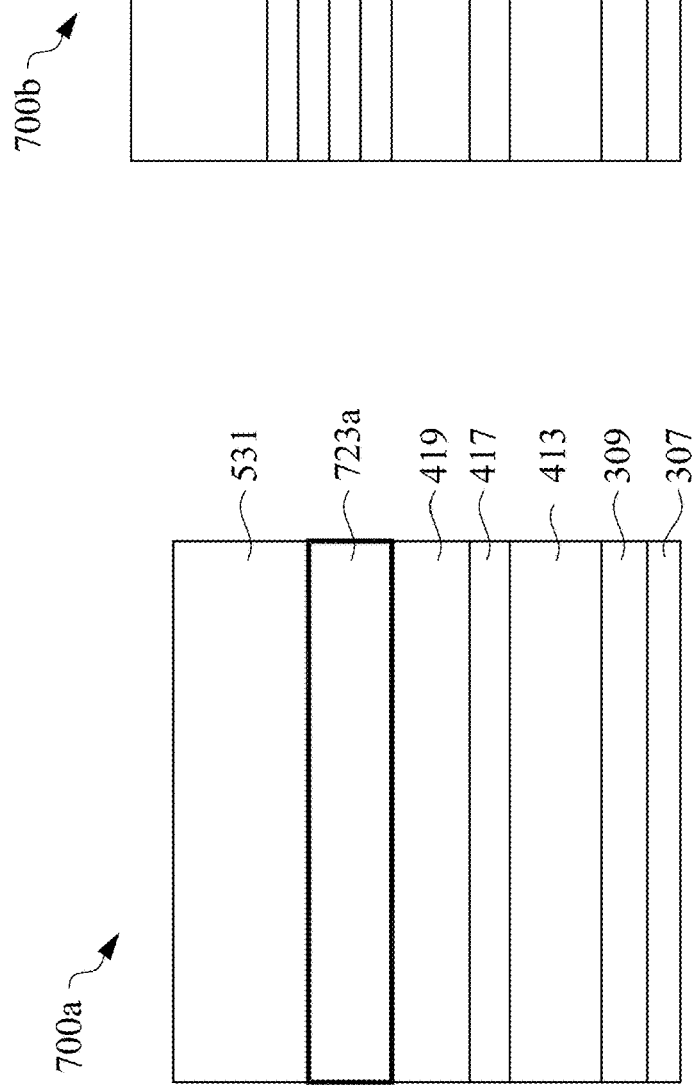
Figure 7D:
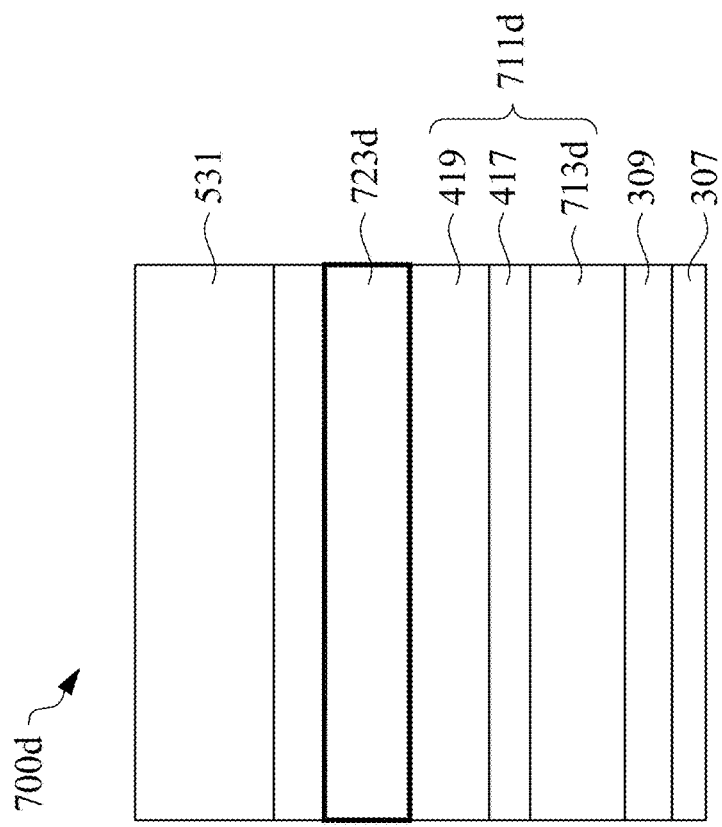
Figure 7C:
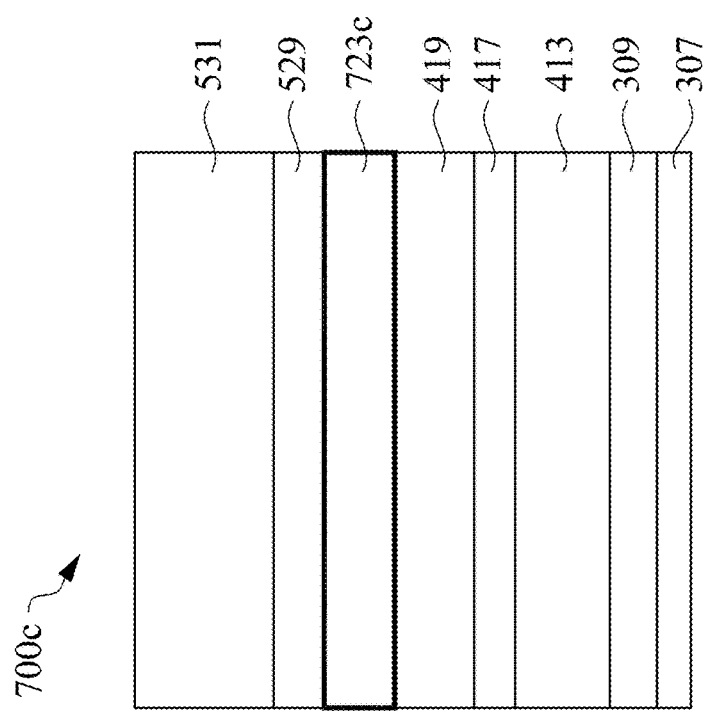

FIGS. 7A-7D illustrate various embodiments of semiconductor devices 700a-700d with diffusion barrier layers to block alkali metals, in accordance with some embodiments. Referring to FIG. 7A, semiconductor device 700a may have diffusion barrier layer 723a but no glue layer, as diffusion barrier layer 723a can act as a glue layer and metal layer 531 can be deposited on diffusion barrier layer 723a. For example, diffusion barrier layer 723a may include TiSiN, VN, $WSe_2$, and $NbSe_2$, which can act as a glue layer. Referring to FIG. 7B, semiconductor device 700b may have multiple diffusion barrier layers and glue layers to improve blocking of alkali metal diffusion. For example, semiconductor device 700b may have diffusion barrier layer 723b-1, glue layer 729b-1, diffusion barrier layer 723b-2, and glue layer 729b-2 stacked on one another as shown in FIG. 7B. Though FIG. 7B show two sets of diffusion barrier layers and glue layers, semiconductor device 700b can have additional sets of diffusion barrier layers and glue layers similar to diffusion barrier layer 723b-1 and glue layer 729b-1. Referring to FIG. 7C, diffusion barrier layer 723c can be grown from capping layer 419 by annealing capping layer 419 in an oxygen or nitrogen environment as described in operation 230. Referring to FIG. 7D, work function stack 711d including work function layer 713d can be treated in a hydrogen environment as described in operation 220 to reduce carbon and Al—C compound concentrations in work function layer 713d. Lower Al—C compound and/or other C impurity concentration may attract less alkali metals around the interface of gate dielectric layer 303 and fin structures 110. In some embodiments, the hydrogen treatment can be performed after the formation of capping layer 419. In some embodiments, the hydrogen treatment can be performed after the formation of diffusion barrier layer 723d. In some embodiments, the hydrogen treatment of work function layers can be performed in semiconductor devices 700a-700c to further reduce diffusion of alkali metals.

Figure 8A:
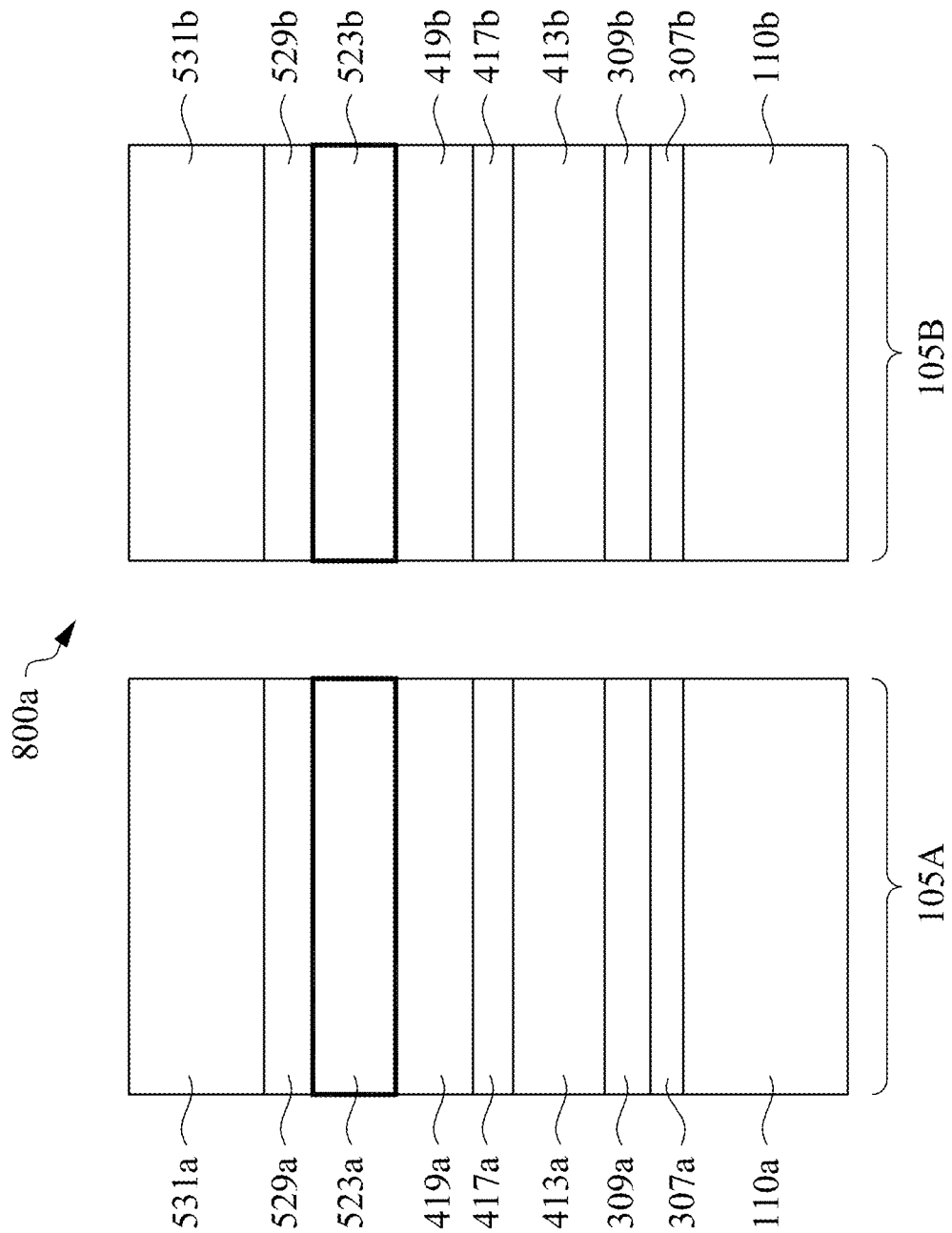
FIGS. 8A-8B illustrate various embodiments of semiconductor devices with diffusion barrier layers for different types of transistors, in accordance with some embodiments.
Figure 8B:
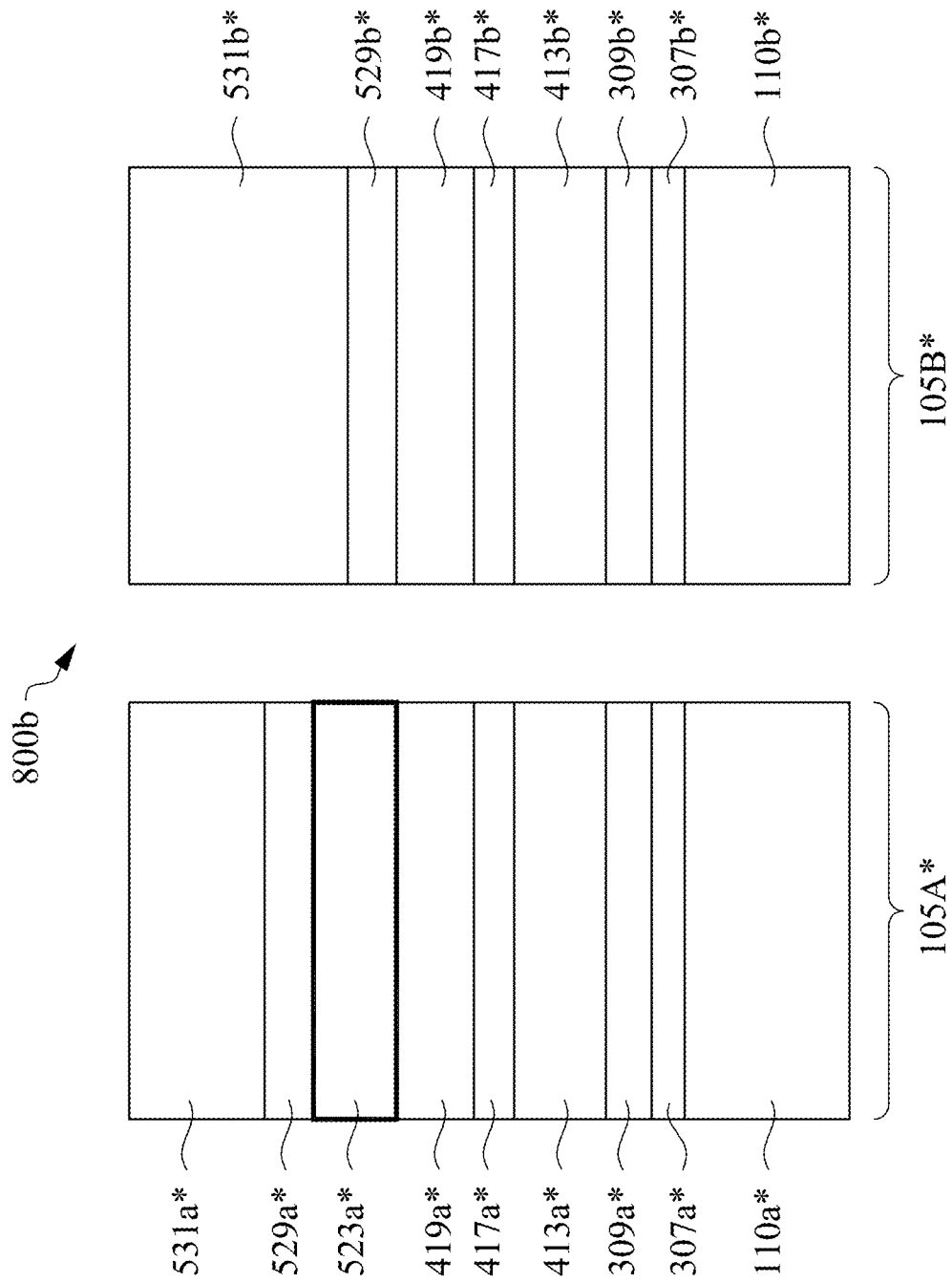

FIGS. 8A-8B illustrate various embodiments of semiconductor devices with diffusion barrier layers for different types of transistors, in accordance with some embodiments. For example, as shown in FIG. 8A, semiconductor device 800a can have diffusion barrier layers 523a and 523b for NFET 105A and PFET 105B, respectively. Referring to FIG. 8B, semiconductor device 800b can have diffusion barrier layer 523a* for NFET 105A* but no diffusion barrier layer for PFET 105B*. Because fin structures 110A and 110A* of n-type transistors (e.g., NFET 105A and 105A*) can have more surface defects and damage, diffusion barrier layer 523a* can be selectively deposited on NFET 105A* but not on PFET 105B* to improve device performance. In some embodiments, the selective deposition can be achieved by using substrate and/or area selective deposition processes. In some embodiments, diffusion barrier layer 523a* can be blanket deposited on both NFET 105A* and PFET 105B* and selectively removed from PFET 105B* in subsequent processes.

Figure 9:
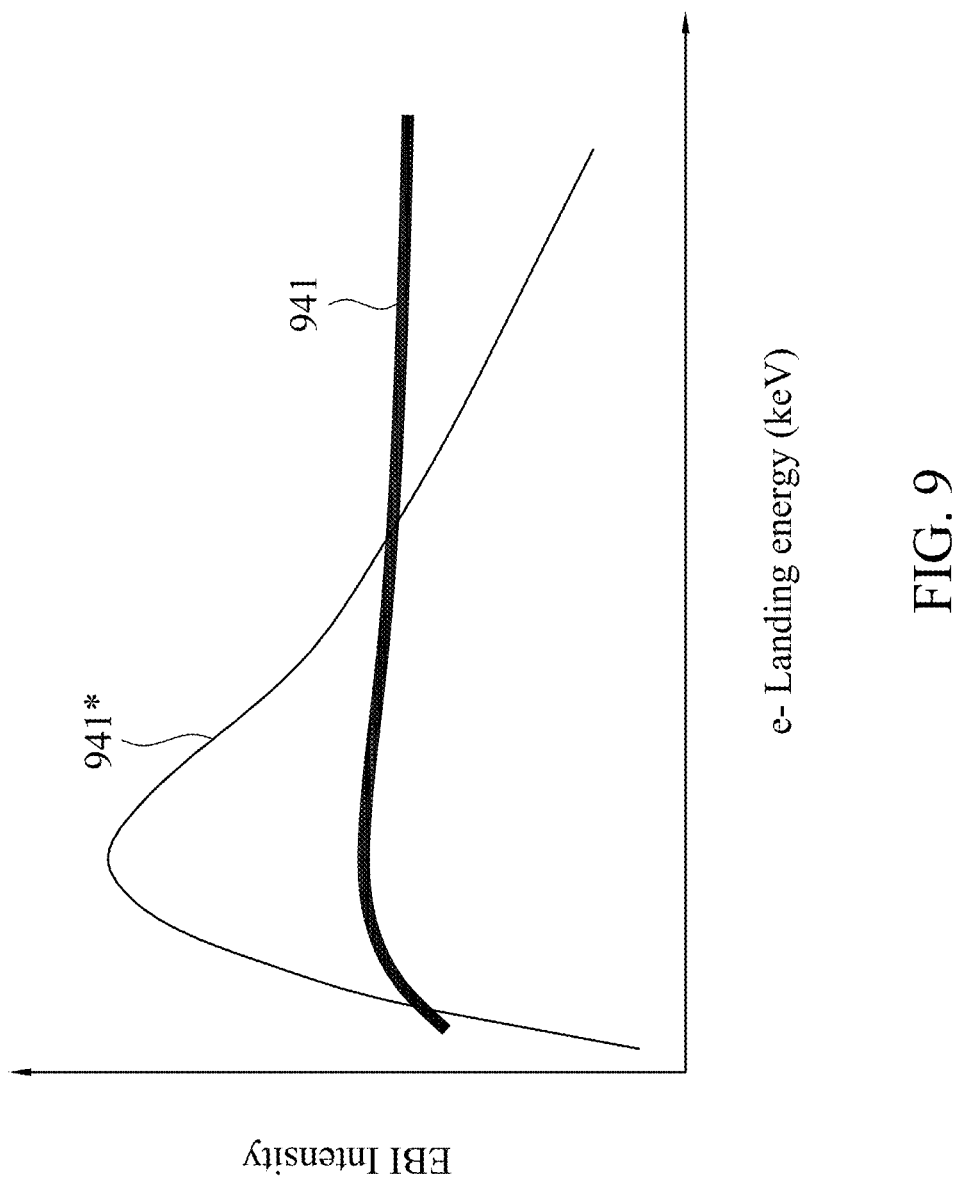
FIG. 9 illustrates a comparison of charging effects for a semiconductor device with and without a diffusion barrier layer, in accordance with some embodiments.

FIG. 9 illustrates a comparison of charging effects for a semiconductor device with and without a diffusion barrier layer, in accordance with some embodiments. As shown in FIG. 9, curve 941 can illustrate the secondary electron yield, e-beam inspection (EBI) intensity as a function of electron landing energy for a semiconductor device with a diffusion barrier layer and curve 941* can illustrate the secondary electron yield for a semiconductor device without a diffusion barrier layer. Curve 941* can demonstrate the charging effect of the semiconductor device without a diffusion barrier layer under e-beam inspection due to defects and non-uniform interfaces around the gate dielectric layer and the fin structure. The EBI intensity in curve 941* can first increase and then decrease as a function of electron landing energy. Curve 941 can have constant secondary e-beam intensity with the increase of electron landing energy for the semiconductor device with diffusion barrier layer, indicating reduced defects and improved roughness around the interfaces.

Figure 10:
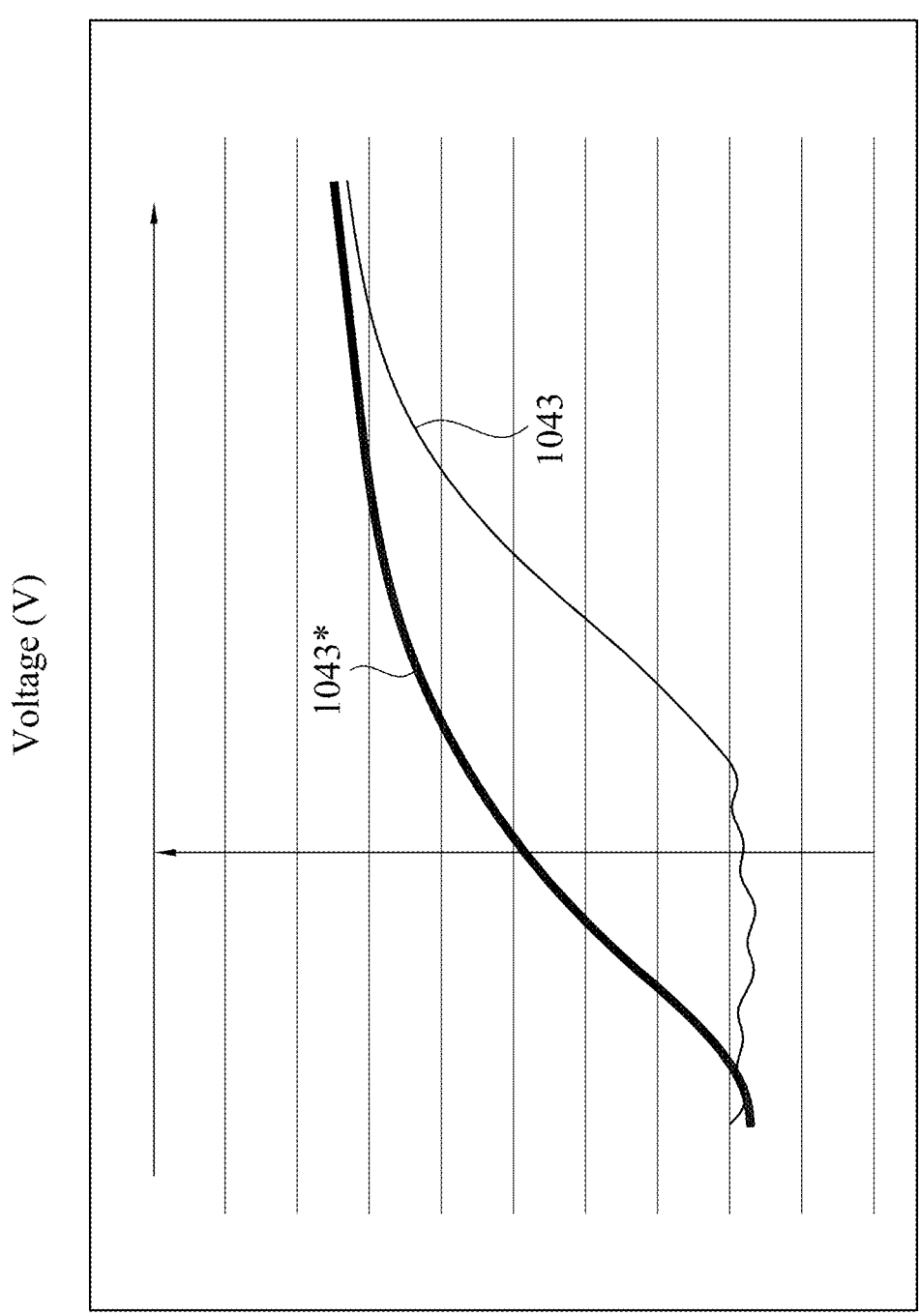
FIG. 10 illustrates a comparison of current-voltage (I-V) curves for a semiconductor device with and without a diffusion barrier layer, in accordance with some embodiments.

FIG. 10 illustrates a comparison of current-voltage (I-V) curves for a semiconductor device with and without a diffusion barrier layer, in accordance with some embodiments. As shown in FIG. 10, curve 1043 can illustrate the I-V curve of a semiconductor device with a diffusion barrier layer and curve 1043* can illustrate the I-V curve of a semiconductor device without a diffusion barrier layer. Curve 1043 can have a lower off-current ($I_{off}$) than curve 1043* when the gate voltage of the semiconductor device is lower, due to improved interface properties between the gate dielectric layer and the fin structure of the semiconductor device with a diffusion barrier layer. In some embodiments, the $I_{off}$ of the semiconductor device with a diffusion barrier layer can be improved about 1000 times, and the threshold voltage can be improved by about 350 mV.

Various embodiments of the present disclosure provide methods for forming semiconductor device 100 and other semiconductor devices with diffusion barrier layer 523. In some embodiments, gate dielectric layer 303 of semiconductor device 100 can be formed on fin structures 110. Work function stacks 411A and 411B can be formed on gate dielectric layer 303. Diffusion barrier layer 523 can be formed on work function stacks 411A and 411B to block the diffusion of alkali metals (e.g., Na, Li and K) and other impurities (e.g., F and OH) to work function stacks 411A-411B, gate dielectric layer 303, and fin structures 110. Diffusion barrier layer 523 can isolate work function stacks 411A-411B and gate dielectric layer 303 from CMG etching gases and/or wet chemicals, thereby avoiding contaminations (e.g., Br, Cl, O, and F) from these chemicals. Diffusion barrier layer 523 can reduce defects around the interface of gate dielectric layer 303 and fin structures 110 and improve channel structure surface roughness, thereby improving threshold voltage and device performance. In some embodiments, glue layer 529 can be formed on diffusion barrier layer 523, and metal layer 531 can be formed on glue layer 529. In some embodiments, diffusion barrier layer 723a shown in FIG. 7A can also act as a glue layer and metal layer 531 can be formed on diffusion barrier layer 723a. In some embodiments, semiconductor device 700b can have multiple diffusion barrier layers 723b-1 and 723b-2 and multiple glue layers 729b-1 and 729b-2 shown in FIG. 7B to improve the blocking of alkali metals and other impurities. In some embodiments, capping layer 419 can be treated in an oxygen or a nitrogen environment to form diffusion barrier layer 723c shown in FIG. 7C. In some embodiments, diffusion barrier layer 523 can be deposited on work function stack 411A shown in FIGS. 5A-5C. In some embodiments, work function stack 711d shown in FIG. 7D can be treated in a hydrogen environment to reduce a carbon concentration in work function layer 713d and thereby reduce the attraction of alkali metals by Al—C compounds and/or other C impurities (e.g., Ti—C, Ta—C, W—C, Ru—C, Co—C, Si—C, and Mo—C) in work function layer 713d.

In some embodiments, a method includes forming a gate dielectric layer on a fin structure, forming a work function stack on the gate dielectric layer, reducing a carbon concentration in the work function stack, forming a barrier layer on the work function stack, and forming a metal layer over the barrier layer. The barrier layer blocks a diffusion of impurities into the work function stack, the gate dielectric layer and the fin structure.

In some embodiments, a method includes forming a first gate dielectric layer on a first fin structure and a second gate dielectric layer on a second fin structure, forming a first work function stack on the first gate dielectric layer and a second work function stack on the second gate dielectric layer, reducing a carbon concentration in the first and second work function stacks, forming a barrier layer on at least one of the first and second work function stacks, and forming a metal layer over the barrier layer and the first and second work function stacks. The second work function stack has a different conductivity type from the first work function stack.

In some embodiments, a semiconductor device includes a fin structure on a substrate, a gate dielectric layer on the fin structure, a work function stack on the gate dielectric layer, a barrier layer on the gate dielectric layer, and a metal layer over the barrier layer. A concentration of an alkali metal in the work function stack is less than that in the metal layer.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a gate dielectric layer on a fin structure;
forming a work function layer on the gate dielectric layer;
forming a capping layer on the work function layer;
forming a barrier layer on the capping layer;
performing a hydrogen treatment on the work function layer, the capping layer, and the barrier layer after forming the barrier layer; and
forming a glue layer on the barrier layer after performing the hydrogen treatment.

2. The method of claim 1, wherein:
a crystallinity of the barrier layer is less than about 35 percent;
a thickness of the barrier layer ranges from about 3 Å to about 80 Å; and
the barrier layer comprises at least one of tin oxide, zinc oxide, manganese oxide, molybdenum oxide, molybdenum disulfide, zinc sulfide, tungsten disulfide, tungsten diselenide, niobium diselenide, vanadium oxide, vanadium sulfide, chromium oxide, chromium sulfide, titanium silicon nitride, titanium carbon nitride, tantalum titanium nitride, tungsten titanium nitride, tantalum silicon nitride, tungsten silicon nitride, silicon nitride, vanadium nitride, silicon oxynitride, titanium oxide, silicon oxide, aluminum oxide, and zirconium oxide.

3. The method of claim 1, further comprising:
forming a shield layer on the work function layer.

4. The method of claim 1, further comprising:
forming a metal layer on the glue layer.

5. The method of claim 1, further comprising:
forming an additional barrier layer on the glue layer;
forming an additional glue layer on the additional barrier layer; and
forming a metal layer on the additional glue layer.

6. The method of claim 1, wherein performing the hydrogen treatment comprises treating the capping layer and the work function layer in a hydrogen environment.

7. The method of claim 1, wherein forming the barrier layer comprises depositing the barrier layer on the capping layer.

8. The method of claim 1, wherein forming the barrier layer comprises treating the capping layer in an oxygen environment or a nitrogen environment.

9. A method, comprising:
forming a first gate dielectric layer on a first fin structure and a second gate dielectric layer on a second fin structure;
forming a first work function layer on the first gate dielectric layer and a second work function layer on the second gate dielectric layer, wherein the second work function layer has a different conductivity type from the first work function layer;
forming a capping layer on the first and second work function layers;
forming a barrier layer on the capping layer over at least one of the first and second work function layers;
performing a hydrogen treatment on the first and second work function layers, the capping layer, and the barrier layer;
forming a glue layer on the barrier layer; and
forming a metal layer on the glue layer.

10. The method of claim 9, wherein a crystallinity of the barrier layer is less than about 35 percent, and wherein the barrier layer blocks a diffusion of at least one of alkali metals, fluorine, chlorine, and bromine to the first and second work function layers, the first and second gate dielectric layers, and the first and second fin structures.

11. The method of claim 9, further comprising forming a shield layer on the first and second work function layers.

12. The method of claim 9, further comprising:
forming an additional barrier layer on the glue layer; and
forming an additional glue layer on the additional barrier layer.

13. The method of claim 9, wherein performing the hydrogen treatment comprises treating the first and second work function layers, the capping layer, and the barrier layer in a hydrogen environment.

14. The method of claim 9, wherein forming the barrier layer comprises depositing the barrier layer on the capping layer.

15. The method of claim 9, wherein forming the barrier layer comprises treating the capping layer in an oxygen environment or a nitrogen environment.

16. The method of claim 9, wherein forming the barrier layer comprises depositing at least one of tin oxide, zinc oxide, manganese oxide, molybdenum oxide, molybdenum disulfide, zinc sulfide, tungsten disulfide, tungsten diselenide, niobium diselenide, vanadium oxide, vanadium sulfide, chromium oxide, chromium sulfide, titanium silicon nitride, titanium carbon nitride, tantalum titanium nitride, tungsten titanium nitride, tantalum silicon nitride, tungsten silicon nitride, silicon nitride, vanadium nitride, silicon oxynitride, titanium oxide, silicon oxide, aluminum oxide, and zirconium oxide.

17. A semiconductor device, comprising:
a fin structure on a substrate;
a gate dielectric layer on the fin structure;
a work function layer on the gate dielectric layer;
a shield layer on the work function layer;
a barrier layer over the shield layer;
a glue layer on the barrier layer; and
a metal layer on the glue layer, wherein a concentration of an alkali metal in the work function layer is less than that in the metal layer.

18. The semiconductor device of claim 17, wherein:
a crystallinity of the barrier layer is less than about 35 percent;
a thickness of the barrier layer ranges from about 3 Å to about 80 Å; and
the barrier layer comprises at least one of tin oxide, zinc oxide, manganese oxide, molybdenum oxide, molybdenum disulfide, zinc sulfide, tungsten disulfide, tungsten diselenide, niobium diselenide, vanadium oxide, vanadium sulfide, chromium oxide, chromium sulfide, titanium silicon nitride, titanium carbon nitride, tantalum titanium nitride, tungsten titanium nitride, tantalum silicon nitride, tungsten silicon nitride, silicon nitride, vanadium nitride, silicon oxynitride, titanium oxide, silicon oxide, aluminum oxide, and zirconium oxide.

19. The semiconductor device of claim 17, wherein:
a carbon concentration in the work function layer is less than about 2 atomic percent; and
a roughness at an interface between the gate dielectric layer and the fin structure is less than about 0.3 nm.

20. The semiconductor device of claim 17, wherein:
a sodium concentration in the gate dielectric layer is less than about $5\times10^{15}$ atoms/cm$^{-3}$; and
a potassium concentration in the gate dielectric layer is less than about $1\times10^{18}$ atoms/cm$^{-3}$.

* * * * *